United States Patent
Patil et al.

(10) Patent No.: US 12,107,590 B2
(45) Date of Patent: Oct. 1, 2024

(54) DIGITAL CORRECTION OF DIGITAL-TO-ANALOG CONVERTER ERRORS IN CONTINUOUS-TIME ANALOG-TO-DIGITAL CONVERTERS

(71) Applicant: Analog Devices International Unlimited Company, Limerick (IE)

(72) Inventors: Sharvil Pradeep Patil, Toronto (CA); Asha Ganesan, Markham (CA); Hajime Shibata, Toronto (CA); Donald W. Paterson, Winchester, MA (US); Haiyang Zhu, Winchester, MA (US)

(73) Assignee: Analog Devices International Unlimited Company, Limerick (IE)

( * ) Notice: Subject to any disclaimer, the term of this patent is extended or adjusted under 35 U.S.C. 154(b) by 218 days.

(21) Appl. No.: 18/049,278

(22) Filed: Oct. 24, 2022

(65) Prior Publication Data

US 2024/0080033 A1    Mar. 7, 2024

Related U.S. Application Data

(60) Provisional application No. 63/403,947, filed on Sep. 6, 2022.

(51) Int. Cl.
*H03M 1/06* (2006.01)
*H03M 1/10* (2006.01)
*H03M 1/16* (2006.01)

(52) U.S. Cl.
CPC ....... *H03M 1/0604* (2013.01); *H03M 1/1038* (2013.01); *H03M 1/1047* (2013.01); *H03M 1/164* (2013.01)

(58) Field of Classification Search
CPC ............ H03M 1/0604; H03M 1/1038; H03M 1/1047; H03M 1/164
USPC ................................. 341/118, 155, 156, 161
See application file for complete search history.

(56) References Cited

U.S. PATENT DOCUMENTS 9,614,510 B2 *   4/2017   Srinivasan ............ H03M 3/386
11,218,158 B1 *  1/2022   Patil .................... H03M 1/1071

* cited by examiner

*Primary Examiner* — Khai M Nguyen
(74) *Attorney, Agent, or Firm* — Schwegman Lundberg & Woessner, P.A.

(57) ABSTRACT

Continuous-time (CT) analog-to-digital converters (ADCs) implementing digital correction of digital-to-analog converter (DAC) errors are disclosed. In a CT pipeline stage of a CT ADC, a CT analog input signal is sent to two different paths. A first path (a "feedforward" path) includes a cascade of a sub-ADC and a sub-DAC. A second path (a "forward" path) includes an analog delay circuit to align the delays of the input signal in the feedforward and forward paths. A combiner subtracts the output of the analog delay of the forward path from the output of the sub-DAC in the feedforward path to generate a residue signal. Devices and methods disclosed herein are based on recognition that, if the errors introduced by the sub-DAC are known, they can be corrected in the digital domain during reconstruction, achieving superior NSD and distortion performance compared to conventional approaches.

20 Claims, 14 Drawing Sheets

Measurements
(M represents number of UEs)

$$m_i[n] = (\Delta e_{si} + \Delta e_{ti})f[n] - \Delta e_{ti}f[n-1]$$

$$m_{swi}[n] = 0.5(e_{swi} + e_{swref})f[n]$$

$$m_{sw,ave}[n] = \frac{1}{M-1}\sum_{i=1}^{M-1} m_{swi}$$

$$\approx 0.5\frac{M-2}{M-1}e_{swref}f[n]$$

Extracted Errors $$\Delta e_{si} = \frac{1}{f[0]}\left[m_i[0]\left(1 - \frac{f[1]}{f[0]}\right) + m_i[1]\right]$$

$$\Delta e_{ti} = \frac{1}{f[0]}\left[m_i[0]\frac{f[1]}{f[0]} - m_i[1]\right]$$

$$e_{swi} \approx 2\frac{m_{swi}[0] - \frac{M-1}{M-2}m_{sw,ave}[0]}{f[0]}$$

FIG. 6B

DIGITAL CORRECTION OF DIGITAL-TO-ANALOG CONVERTER ERRORS IN CONTINUOUS-TIME ANALOG-TO-DIGITAL CONVERTERS

CROSS-REFERENCE TO RELATED APPLICATIONS

This application claims the benefit of and priority from U.S. Provisional Application No. 63/403,947 filed on Sep. 6, 2022, entitled "DIGITAL CORRECTION OF DIGITAL-TO-ANALOG CONVERTER ERRORS IN CONTINUOUS-TIME ANALOG-TO-DIGITAL CONVERTERS," incorporated herein by reference in its entirety.

TECHNICAL FIELD OF THE DISCLOSURE

The present disclosure relates generally to the field of electronic circuits and, more particularly, to systems and methods for data conversion.

BACKGROUND

Analog signals and/or values can be produced in various kinds of circuit elements, such as signal generators, sensors, and antennas. However, there can be many instances where having digital signals or values can be beneficial, such as for further processing or storing of the signals or values. To utilize the benefits of having a digital signal or value when an analog signal or value has been produced, analog-to-digital converters (ADCs) have been developed for converting analog signals or values to digital signals or values.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 6A and 6B illustrate a foreground extraction approach for determining DAC errors, according to some embodiments of the present disclosure;

DESCRIPTION OF EXAMPLE EMBODIMENTS OF THE DISCLOSURE

Figure 1:
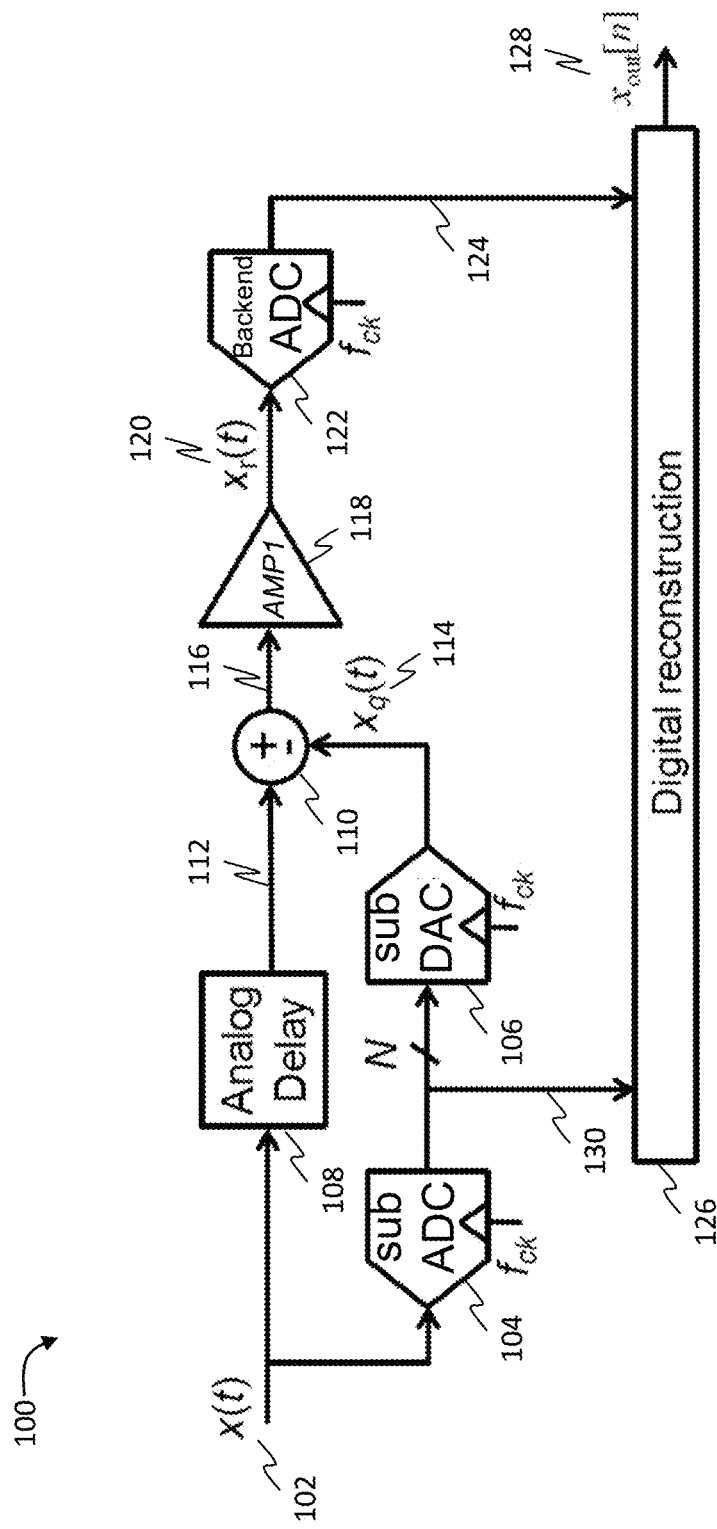
FIG. 1 provides a schematic illustration of a continuous-time (CT) ADC in which digital correction of digital-to-analog converter (DAC) errors may be implemented, according to some embodiments of the present disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating CT ADCs implementing digital correction of DAC errors, proposed herein, it might be useful to first understand phenomena that may come into play in CT ADCs. The following foundational information may be viewed as a basis from which the present disclosure may be properly explained. Such information is offered for purposes of explanation only and, accordingly, should not be construed in any way to limit the broad scope of the present disclosure and its potential applications.

ADCs are electronic devices that convert a continuous physical quantity carried by an analog signal to a digital number that represents the quantity's amplitude (or to a digital signal carrying that digital number). The conversion involves quantization of the analog input signal, i.e., a process of mapping input values from a continuous set of analog values to output values in a countable smaller set of digital values, so it would introduce a small amount of error. Typically, the quantization occurs through periodic sampling of the analog input signal. The result is a sequence of digital values (i.e., a digital signal) that represents conversion of a CT and continuous-amplitude analog input signal to a discrete-time (DT) and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including noise spectral density (NSD), signal to noise ratio (SNR), signal-to-noise-and-distortion ratio (SNDR), effective number of bits (ENOB), total harmonic distortion (THD), total harmonic distortion plus noise (THD+N), and spurious free dynamic range (SFDR).

ADCs have many different designs, which can be chosen based on the application requirements and performance specifications. CT ADC (also sometimes referred to as a CT pipelined (CTP) ADC) refers to an ADC design that is based on CT residue generation. CT ADCs are increasingly popular in high-performance and high-speed data converters, partly due to their inherent anti-aliasing and their potential to achieve high sampling rates, driven by their feedforward architecture. In a CT pipeline stage of an ADC, a CT analog input signal is sent to two different paths. A first path, typically referred to as a "feedforward" path, includes a cascade of a quantizer (referred to in the following as a "sub-ADC") and a feedforward DAC (referred to in the following as a "sub-DAC"). A second path, typically referred to as a "forward" path, includes an analog delay circuit to align the delays of the input signal in the feedforward and forward paths. A combiner may then subtract the output of the analog delay of the forward path from the output of the sub-DAC in the feedforward path to generate a residue signal. This residue signal may then be processed, e.g., filtered and amplified by an amplifier, and the processed residue signal may be provided to subsequent stages of the ADC or to a backend-ADC for the generation of the final output signal of the CT ADC based on the residue signal and based on the digital output of the sub-ADC of the feedforward path. For example, the sub-ADC may output a lower resolution and less accurate digital representation of the input signal value (e.g., a 5-bit digital value), while the residue signal indicative of the difference between the coarse conversion of the input value by the sub-ADC and the actual input value may allow generating a higher resolution and more accurate digital representation of the input signal value (e.g., a 10- or a 16-bit digital value).

Sub-DAC of a CT ADC includes a plurality of UEs configured to convert digital bits that they receive at their inputs to analog values. Although designed to be identical to one another, real-life UEs of a single sub-DAC may differ from one another due to manufacturing variations, causing so-called "mismatch errors." More generally, UEs of a single sub-DAC may differ from one another due to process, voltage, or temperature (PVT) variations, causing a multitude of potential sub-DAC errors. As a result, keeping the distortion of a CT ADC within acceptable limits, e.g., below −80 decibels relative to full scale (dBFS), is very challenging.

A variety of approaches have been used in the past to address sub-DAC mismatch. Inventors of the present disclosure realized that all such conventional approached are associated with some drawbacks. For example, an approach of brute-force sizing may reduce static mismatch errors but worsen dynamic ones. In another example, an approach based on analog correction using calibration DACs may, similarly, address static mismatch errors but scaling to address dynamic mismatch errors may impose non-trivial complexity and power penalties. In yet another example, approaches based on mismatch-shaping techniques may be powerful but may add delay in the critical feedforward path, making them unsuitable for high-speed ADCs. Dynamic element matching via reference shuffling is de rigueur at these speeds, but, while reducing the distortion, it incurs a noise penalty (i.e., worsens NSD) when oversampling ratios (OSRs) are low and may, therefore, be prohibitive in some CT ADC implementations. Simultaneously achieving both low NSD and low distortion in a CT ADC is a tough problem.

Embodiments of the present disclosure are based on recognition that, if the errors introduced by the sub-DAC are known ahead of time (i.e., a priori known), they can be corrected in the digital domain during reconstruction. To that end, one aspect of the present disclosure provides devices and methods that aim to reduce or eliminate various sub-DAC errors based on estimating these errors and then correcting them in the digital domain. Another aspect of the present disclosure provides devices and methods for extracting (e.g., determining/quantifying) sub-DAC errors so that they can be digitally corrected. Fully digital correction of sub-DAC errors as described herein may achieve superior NSD and distortion performance compared to conventional approaches. In the present disclosure, references to "digital correction of DAC errors" cover any one or both of 1) correcting the DAC errors in the digital domain, and 2) estimating/extracting the DAC errors to be corrected in the digital domain.

While some descriptions provided herein may refer to sub-DAC mismatch errors, mismatch is just one type of errors that may be digitally corrected as described herein. Thus, in general, descriptions of the present disclosure referring to mismatch errors are applicable to any other types of sub-DAC errors, all of which could be corrected using the digital correction solutions presented herein.

Mechanisms described herein may be applicable to CT as well as hybrid (i.e., part CT, part DT) ADCs and may be implemented in ADCs of various types of architectures, such as pipelined ADCs, multi-stage noise shaping (MASH) ADCs, voltage controller oscillator (VCO) ADCs, and other ADCs utilizing generation and processing of residue signals. In general, in context of the present disclosure, describing an ADC as a "CT ADC" refers to any ADC that may include at least one CT residue generation stage (thus, "CT ADCs" described herein may, alternatively, be referred to as "CT residue generation arrangements"), and may also include one or more DT stages. Some of the mechanisms described herein may be especially attractive for high-performance and high-speed converter applications.

As will be appreciated by one skilled in the art, at least some aspects of the present disclosure, in particular at least some aspects of digital correction of DAC errors in CT ADCs as described herein, may be embodied in various manners, e.g., as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." At least some functions described in this disclosure may be implemented as an algorithm executed by one or more hardware processing units, e.g., one or more microprocessors of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Drawings labeled with letters, e.g., FIG. 4A and FIG. 4B, may sometimes be referred to, together, as a drawing without the letter, e.g., as FIG. 4.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" or the term "signal" may be omitted (e.g., an analog input signal 102 shown in the present drawings may be referred to in the present descriptions as an "analog input 102" etc.). If used, the terms "substantially," "approximately," "about," etc., may be used to generally refer to being within +/−10% of a target value, e.g., within +/−5% of a target value or within +/−2% of a target value, based on the context of a particular value as described herein or as known in the art.

Other features and advantages of the disclosure will be apparent from the following description and the claims.

FIG. 1 provides a schematic illustration of a CT ADC 100 in which digital correction of DAC errors may be implemented, according to some embodiments of the present disclosure.

As shown in FIG. 1, the ADC 100 may be configured to receive a CT analog input signal, x(t), 102, e.g., an analog voltage signal Vin(t). Although not specifically shown in FIG. 1, the ADC 100 may include a sample-and-hold (S/H) circuit configured to sample the analog input signal x(t) at a sampling instant (e.g., t=T0) and output a held analog value X of the sampling instant (e.g., output a held analog value VIN at the sampling instant). A value of the analog input signal x(t) is sent to two different paths: a feedforward path and a forward path. The feedforward path includes a cascade of a sub-ADC 104 and a sub-DAC 106. The forward path includes an analog delay circuit 108, configured to apply an analog delay to the input signal 102. Thus, the CT analog input x(t) 102 (i.e., a given analog value of the input signal x(t)) is applied to the delay circuit 108 in the forward path and to a cascade of an N-bit ADC implementing the sub-ADC 104 and an N-bit DAC implementing the sub-DAC 106, each of which may be clocked at a sampling rate of $f_{ck}$ in the feedforward path. The sub-ADC 104 may be configured to derive and output an output signal 130 that includes digital values representing respective analog values of the input signal x(t) provided thereto. For example, a given digital value produced by the sub-ADC 104, e.g., CODE1, may be a relatively low-resolution digital representation of X, e.g., VIN (i.e., the held analog value at a sampling instant t=T0). The ADC 100 may be configured to derive and process a residue of X (e.g., of VIN) with respect to CODE1 as a step of a method to derive a higher resolution and more precise digital representation of X (e.g., of VIN). Specifically, the sub-DAC 106 may be configured to derive and output a sub-DAC output signal $x_q(t)$, 114, which is an analog representation of CODE1. A difference between X and the analog representation of CODE1 is a residue value VRES (i.e., a value of the residue signal 116). For example, a combiner (e.g., a subtractor) 110 may generate a residue signal 116 based on a delayed input signal 112 (which is the output of the forward path of the CT ADC 100) and an output, $x_q(t)$, 114 of the sub-DAC 106 (which is the output of the feedforward path of the CT ADC 100). For example, in some embodiments, the combiner 110 may generate the residue signal 116 by subtracting the feedforward path output, i.e., the sub-DAC output signal 114, from the forward path output 112, or the other way around. The residue signal 116 may be seen as a signal indicative of the quantization error arising from the quantization process performed by the sub-ADC 104. Therefore, in some of the subsequent drawings the residue signal 116 is labeled as "eq" (where "e" stands for "error" and "q" stands for "quantization"). The residue signal 116 may then be processed, e.g., filtered and amplified by an amplifier/filter, AMP1, 118, and the processed residue signal 120 may be provided to subsequent pipeline stages that may be implemented in the ADC 100 (subsequent pipeline stages not specifically shown in FIG. 1). Eventually (e.g., after the last pipeline stage of the ADC 100), a signal based on the processed residue signal 120 may be provided to a backend-ADC 122, to be digitized by the backend-ADC 122 to generate a digital residue signal 124. For example, the backend-ADC 122 may be configured to generate a digital representation (e.g., CODE2) of a residue value VRES accounting for a factor of gain A provided by the amplifier 118. The CT ADC 100 may further include a digital reconstruction circuit 126, configured to generate an ADC output $x_{out}[n]$, 128 based on the digital residue signal 124 output by the backend-ADC 122, a digital signal 130 output by the sub-ADC 104 (e.g., the signal $d_i[n]$ labeled in some of the subsequent drawings), and any digital signals generated by the sub-ADCs in the other pipeline stages in the ADC (not shown in FIG. 1). For example, the digital reconstruction circuit 126 may be configured to derive a high-resolution representation of a given value of the input signal 102 (e.g., of the value VIN) based on a combination of a digital representation produced by the sub-ADC 104 and a digital representation produced by the backend-ADC 122.

The sub-ADC 104, the sub-DAC 106, the delay circuit 108, the combiner 110, and the amplifier 118 may be considered to be a first stage, or a residue generation arrangement, of the ADC 100. In some embodiments, the ADC 100 may include multiple such stages (i.e., multiple CT stages), coupled in series, i.e., the input signal 102 for a stage k+1 may be based on (e.g., may be substantially the same as) the amplified residue signal 120 of a stage k, where k may be a positive integer indicating the positions of stages in a series of consecutive stages of the ADC 100 (e.g., an integer between 1 and K if the ADC 100 includes K residue generation stages). In some embodiments, each of such stages may include a respective (i.e., own) digital reconstruction circuit 126, where the digital reconstruction circuit 126 of the stage k may be configured to generate an ADC output based on the digital signal 130 output by the sub-ADC 104 of the stage i and the ADC output generated by the digital reconstruction circuit 126 of the stage k+1, and the digital reconstruction circuit 126 of the last stage K may be configured to generate its ADC output based on the digital signal 130 output by the sub-ADC 104 of the stage K and the digital residue signal 124 output by the backend-ADC 122, configured to receive a signal indicative of the residue signal 116 output by the combiner 110 of the stage K (e.g., to receive the signal 120).

In other embodiments, the first stage of the ADC 100 may be coupled to a second stage, configured to process a signal based on the residue signal output by the first stage, but the second stage may be a DT stage.

Figure 2:
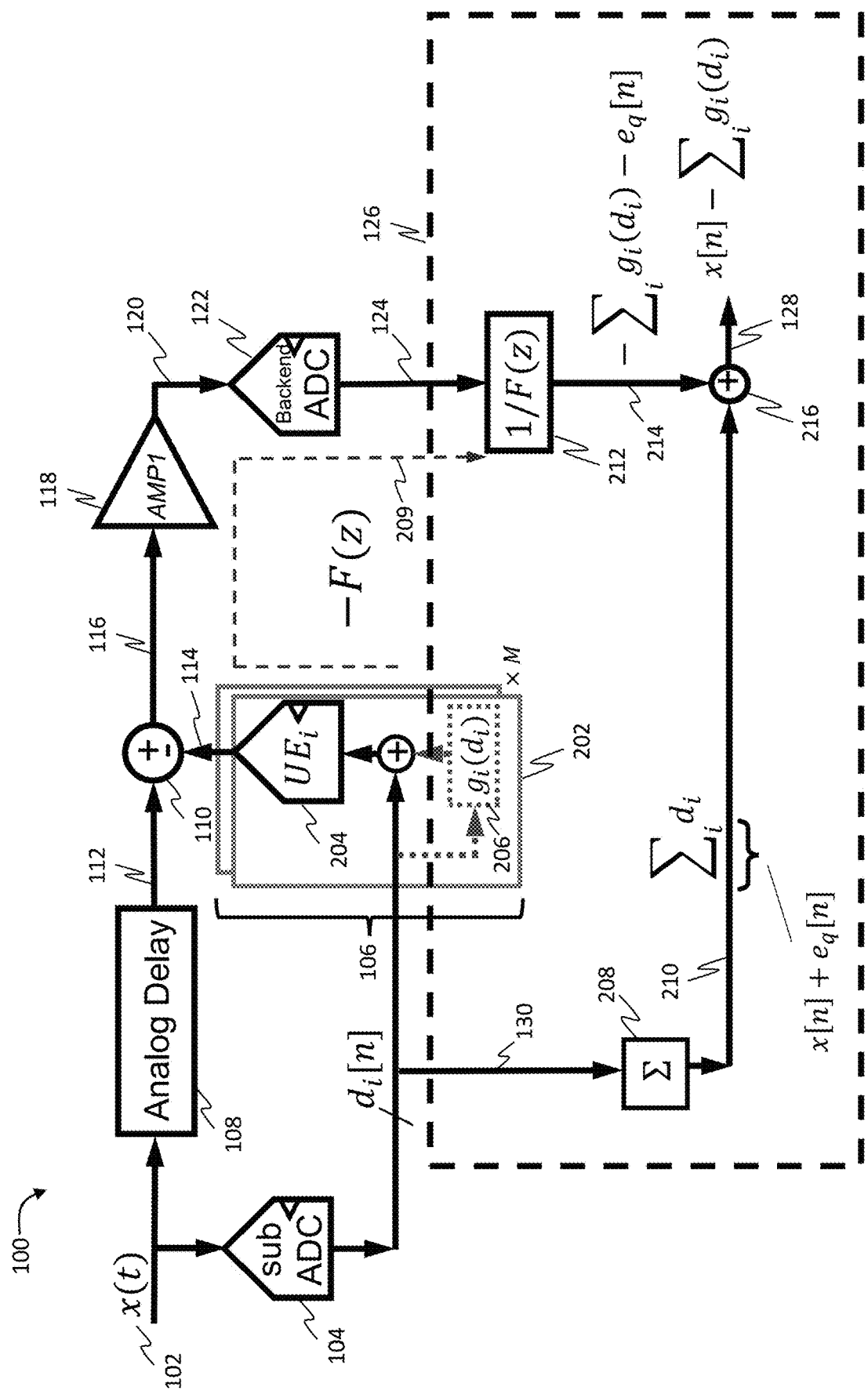
FIG. 2 provides a schematic illustration of the CT ADC of FIG. 1, further illustrating example details of a digital reconstruction circuit, according to some embodiments of the present disclosure.

FIG. 2 provides a schematic illustration of the CT ADC 100 of FIG. 1, further illustrating example details of the digital reconstruction circuit 126, according to some embodiments of the present disclosure.

Figure 3:
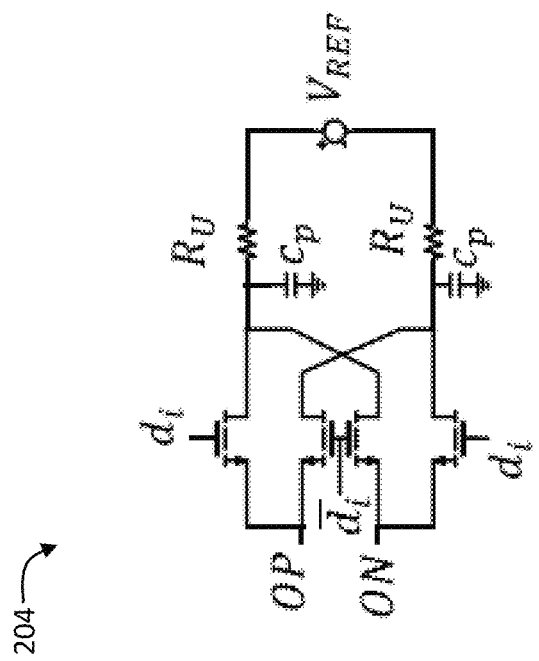
FIG. 3 provides an electric circuit diagram of a unary element (UE) of a sub-DAC of a CT ADC, according to some embodiments of the present disclosure.

As described above, the process of quantization performed by the sub-ADC of the feedforward path, e.g., the sub-ADC 104, may result in a quantization error which is represented by the residue signal 116 (i.e., the output signal of the combiner 110). A combination of the delay circuit 108 in the forward path and a cascade of the sub-ADC 104 and the sub-DAC 106 in the feedforward path may be considered to be a stage 0 (STG0) of the CT ADC 100. The sub-ADC 104 may be an (M+1)-level flash sub-ADC whose M thermometric output bits, $d_i$, are fed into an M-UE sub-DAC 106. To that end, the sub-DAC 106 is represented in FIG. 2 as a collection of M sub-DAC units 202, each comprising a $UE_i$ 204. Example implementation of an individual $UE_i$ 204 is shown in FIG. 3, showing an electric circuit diagram of a resistive non-return-to-zero sub-DAC unit. Design and operation of such UEs is known in the art and, therefore, is not described herein further detail. In various embodiments, CT ADCs implementing digital correction of sub-DAC errors may include different types of UEs 204 than what is shown in FIG. 3, including, e.g., UEs with unequal weightings.

FIG. 2 further illustrates that each of the M sub-DAC units 202 may introduce an error $g_i(d_i)$, represented in FIG. 2 as an error block 206 that receives the signal $d_i[n]$ as an input and generates an error signal that is added to the signal $d_i[n]$, by virtue of an adder 207, and the sum (i.e., the output of the adder 207) is provided to the UE 204 of a given sub-DAC unit 202. Thus, as used herein, $g_i(d_i)$ models the errors of an individual $UE_i$ 204 of the M UEs in the sub-DAC 202 (i.e., the $UE_i$ 204 with the input $d_i$,) and $\hat{g}_i(d_i)$ represents its digital estimate used to correct it, both described in greater detail below, where i is an integer between 0 and M−1, representing one of the M sub-DAC units 202 (e.g., M may be equal to 16 in some embodiments). In the following, in $\hat{g}_i(d_i)$, in accordance with a common mathematical notation, the hat sign is used to indicate that the function is an estimate. The error block 206 and the adder 207 are shown in FIG. 2 and other drawings to be within dotted contours to represent that these components are not actual separate circuits included in the sub-DAC units 202 of the sub-DAC 106 (unlike the UE 204, which is an actual circuit) but, rather, a visual representation used to help visualize how errors generated by the UEs 204 affect the rest of the signal chain.

Also shown in FIG. 2 is an adder 208, configured to sum the individual bits $d_i$ output by the sub-ADC 104 to generate an adder output signal 210 (e.g., a binary signal). In particular, as illustrated in FIG. 2, the adder output signal 210 may be represented as a sum of $\Sigma_i d_i$, which includes the sampled value of the analog input, $x[n]$, and a sub-ADC quantization error, $e_q[n]$. This notation is provided for an example where the bits output by the sub-ADC 104 are thermometric bits, in which case they are summed by the adder 208 using equal weights. Analogous summation would apply if the sub-ADC 104 used an encoding scheme other than thermometric encoding, e.g., binary encoding, in which case the adder 208 would still add the bits output by the sub-ADC 104 but this time the bits would be applied appropriate weights prior to their summation.

Further illustrated in FIG. 2 is a path 209, shown with a dashed arrow, which is a path for signals between the input to the sub-DAC 106 and the output of the backend-ADC 122. A transfer function undergone by the signals travelling the path 209 may be labeled as "−F(z)", as shown in FIG. 2 with this label placed within the path 209. The digital reconstruction circuit 126 may then be configured to generate the output signal 128 based on the estimate of the transfer function F(z). In some embodiments, the transfer function F(z) may be estimated using, e.g., a cross-correlation based method and used to derive a function 1/F(z) to be applied by a digital reconstruction filter (DRF) 212 to generate a DRF output signal 214 based on the digital residue signal 124 output by the backend-ADC 122. As illustrated in FIG. 2, the DRF output signal 214 may be represented as $-\Sigma_i g_i(d_i)-e_q[n]$. The digital reconstruction circuit 126 further includes a DRF combiner 216 to combine the sub-ADC 104 output (represented by the adder output signal 210) and the backend-ADC 122 output (represented by the DRF output signal 214) to obtain the overall ADC output 128. As shown in FIG. 2, the sub-ADC quantization error, $e_q[n]$, appears at the two inputs of the DRF combiner 216 with equal magnitude but opposite signs (i.e., at one input of the DRF combiner 216 as part of the adder output signal 210 and at another input of the DRF combiner 216 as part of the DRF output signal 214), thereby being cancelled upon addition to provide the ADC output signal 128 as $x[n]-\Sigma_i g_i(d_i)$.

As the foregoing illustrates, if no digital correction is applied (i.e., if $\hat{g}_i=0$), the errors added by the sub-DAC UEs 204 (modeled through the error blocks $g_i$ 206) appear at the ADC output 128 as is. These errors may not be neglected in some implementations and, therefore, it is imperative to address this challenge.

Figure 4A:
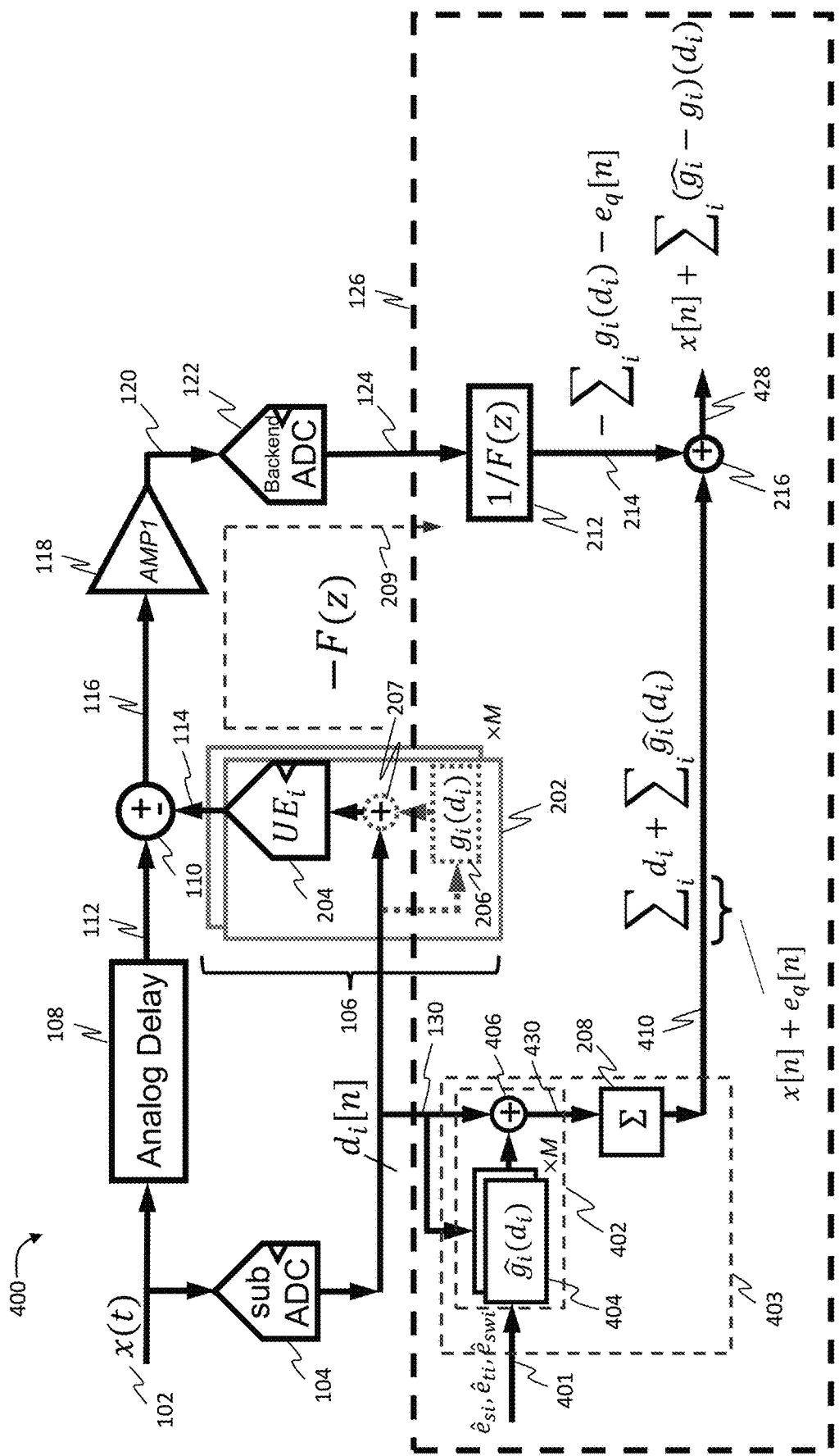
FIGS. 4A and 4B provide a schematic illustration of a CT ADC configured to implement digital correction of DAC errors, according to some embodiments of the present disclosure.

One implementation of the proposed DAC error correction approach will now be described with reference to FIG. 4A, providing a schematic illustration of a CT ADC 400 configured to implement digital correction of DAC errors according to some embodiments of the present disclosure. As shown in FIG. 4A, the CT ADC 400 includes some components of the CT ADC 200, shown with the same reference numerals as those shown in FIG. 2. Description of these components provided above are applicable to FIG. 4A and are not repeated here, and only additional features of the CT ADC 400 are described. One such additional feature is that the CT ADC 400 includes an error correction circuit 403. The error correction circuit 403 includes an error correction unit 402 comprising a plurality (e.g., M) error correction blocks 404. The error correction unit 402 may further include an adder 406. The DAC error correction approach proposed herein is based on the observation that it is possible to digitally correct the errors, $g_i$, provided these errors are known to the error correction circuit 403 (i.e., provided these errors can be accurately estimated). The fact that the errors are known to the error correction circuit 403 is schematically illustrated by the error correction blocks 404 of the error correction unit 402 receiving an input 401 that includes estimates of errors $e_{si}$, $e_{ti}$, and $e_{swi}$, described in greater detail below (again, the hat sign is used the notation of the errors $e_{si}$, $e_{ti}$, and $e_{swi}$ of the input 401 shown in FIG. 4A, i.e., $\hat{e}_{si}$, $\hat{e}_{ti}$, $\hat{e}_{swi}$, to indicate that these are estimates of the corresponding errors). Assuming that $\hat{g}_i(d_i)$ represents the estimate of $g_i(d_i)$, if $\hat{g}_i(d_i)$ is added to the digital path undergone by the sub-ADC output signal 130, as is shown with M error correction blocks 404 and the adder 406, to generate an error-corrected sub-ADC output signal 430 to be provided to the adder 208, then the injected errors $g_i(d_i)$ and the estimated errors $\hat{g}_i(d_i)$ appear with opposite signs in the ADC output 128 and, therefore, if $\hat{g}_i=g_i$, these errors will be effectively cancelled. The error-corrected sub-ADC output signal 430 may be a digital signal similar to the sub-ADC output signal 130 generated by the sub-AC 104, except that the error-corrected sub-ADC output signal 430 is a signal containing error-corrected versions of the M bits of the signal $d_i[n]$ generated by the sub-ADC 104. The adder 208 may then be configured to sum the individual bits $d_i$ output by the sub-ADC 104 and error-corrected, individually, by a respective one of the M error correction blocks 404, to generate a signal 410 that is similar to the adder output signal 210 but in which at least some of the errors $e_{si}$, $e_{ti}$, and $e_{swi}$ have been reduced or eliminated (i.e., the signal 410 may be referred to as an error-corrected adder output signal 210). In particular, as shown in FIG. 4A, when estimated errors $\hat{g}_i(d_i)$ are added by the error correction circuit 403, the error-corrected adder output signal 410 includes not only the sum of the bits $d_i$ output by the sub-ADC 104 (i.e., $\Sigma_i d_i$), as was the case for the adder output signal 210, but also includes the sum of the estimated errors $\hat{g}_i(d_i)$ (i.e., $\Sigma_i \hat{g}_i(d_i)$). In other words, the error-corrected adder output signal 410 of the CT ADC 400 may be represented as $\Sigma_i d_i + \Sigma_i \hat{g}_i(d_i)$. The DRF output signal 214 of the CT ADC 400 remains the same as for the CT ADC 100 shown in FIG. 2, but, because one of the inputs to the DRF combiner 216 is different (namely, the error-corrected adder output signal 410), an ADC output signal produced by the DRF combiner 216 is an error-corrected ADC output signal 428, which is similar to the ADC output signal 128 but includes the error correction. Thus, the error-corrected ADC output signal 428 may be represented as $x[n]+\Sigma_i(\hat{g}_i-g_i)(d_i)$, as shown in FIG. 4A. If $\hat{g}_i=g_i$, then the second term in the error-corrected ADC output signal 428 of the CT ADC 400 becomes zero, leaving only $x[n]$ as the error-corrected ADC output signal 428.

Figure 4B:
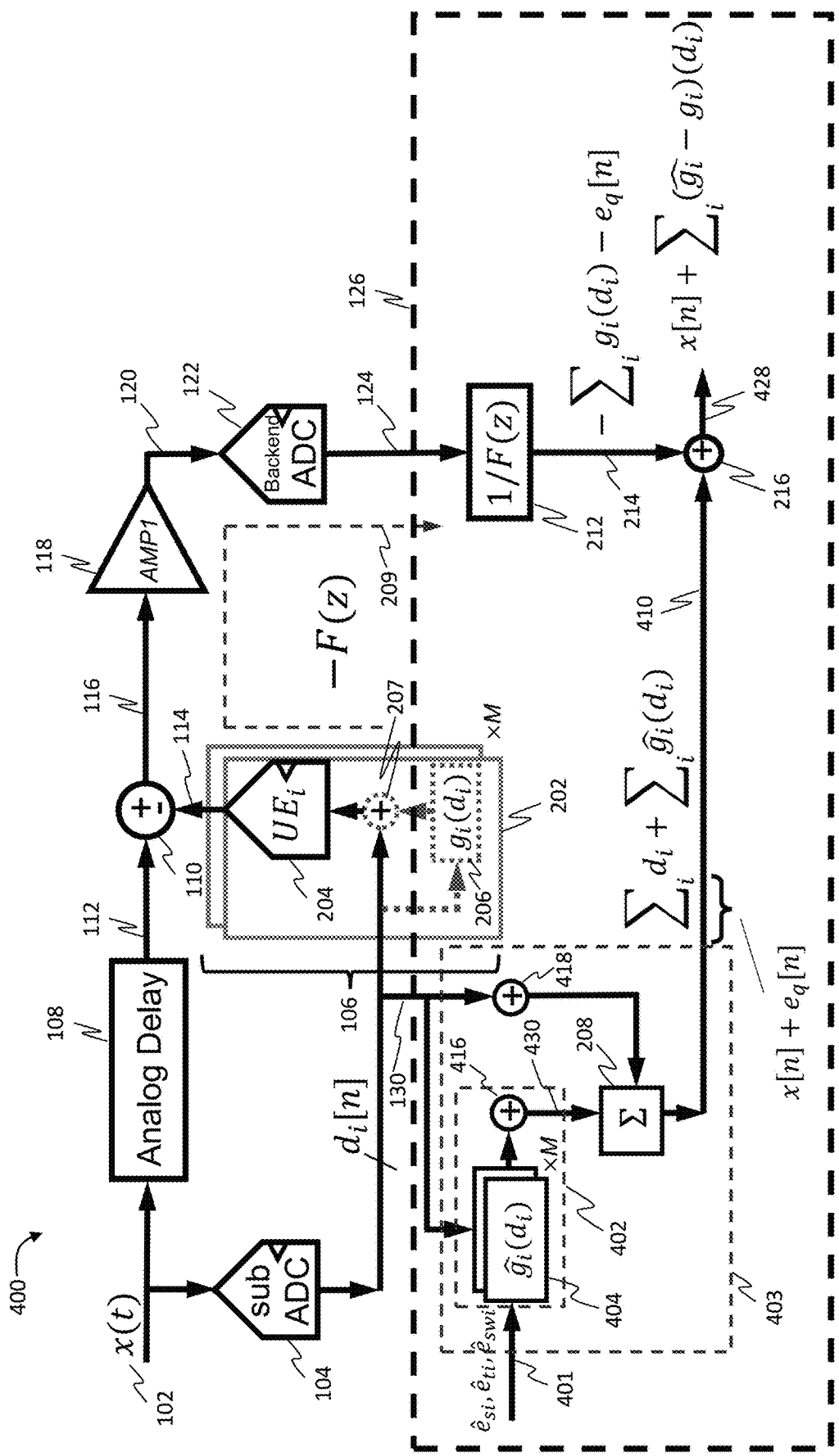

Another implementation of the proposed DAC error correction approach will now be described with reference to FIG. 4B, providing a schematic illustration of a CT ADC 400 configured to implement digital correction of DAC errors according to some embodiments of the present disclosure. In particular, the CT ADC 400 of FIG. 4B is substantially the same as that of FIG. 4A but illustrating an alternative implementation of generating the error-corrected adder output signal 410. In particular, FIG. 4B illustrates that, in some embodiments, the sum of the estimated errors $\hat{g}_i(d_i)$ (i.e., $\Sigma_i \hat{g}_i(d_i)$) may be generated by a first adder 416, the sum of the bits $d_i$ output by the sub-ADC 104 (i.e., $\Sigma_i d_i$) may be generated by a second adder 418, and the outputs of the first adder 416 and the second adder 418 may be added by a third adder 420. Although not specifically illustrated in the present drawings, there are other ways in which the error-corrected adder output signal 410 represented by $\Sigma_i d_i + \Sigma_i \hat{g}_i(d_i)$ may be generated, all of which being within the scope of the present disclosure.

DAC error model and error extraction will now be described. While these descriptions focus on sub-DAC mismatch errors, $g_i$ can be used to model any type of error introduced by the sub-DAC 106 and if it is estimated accurately by $\hat{g}_i(d_i)$, all these errors can be eliminated during reconstruction.

Figure 5A:
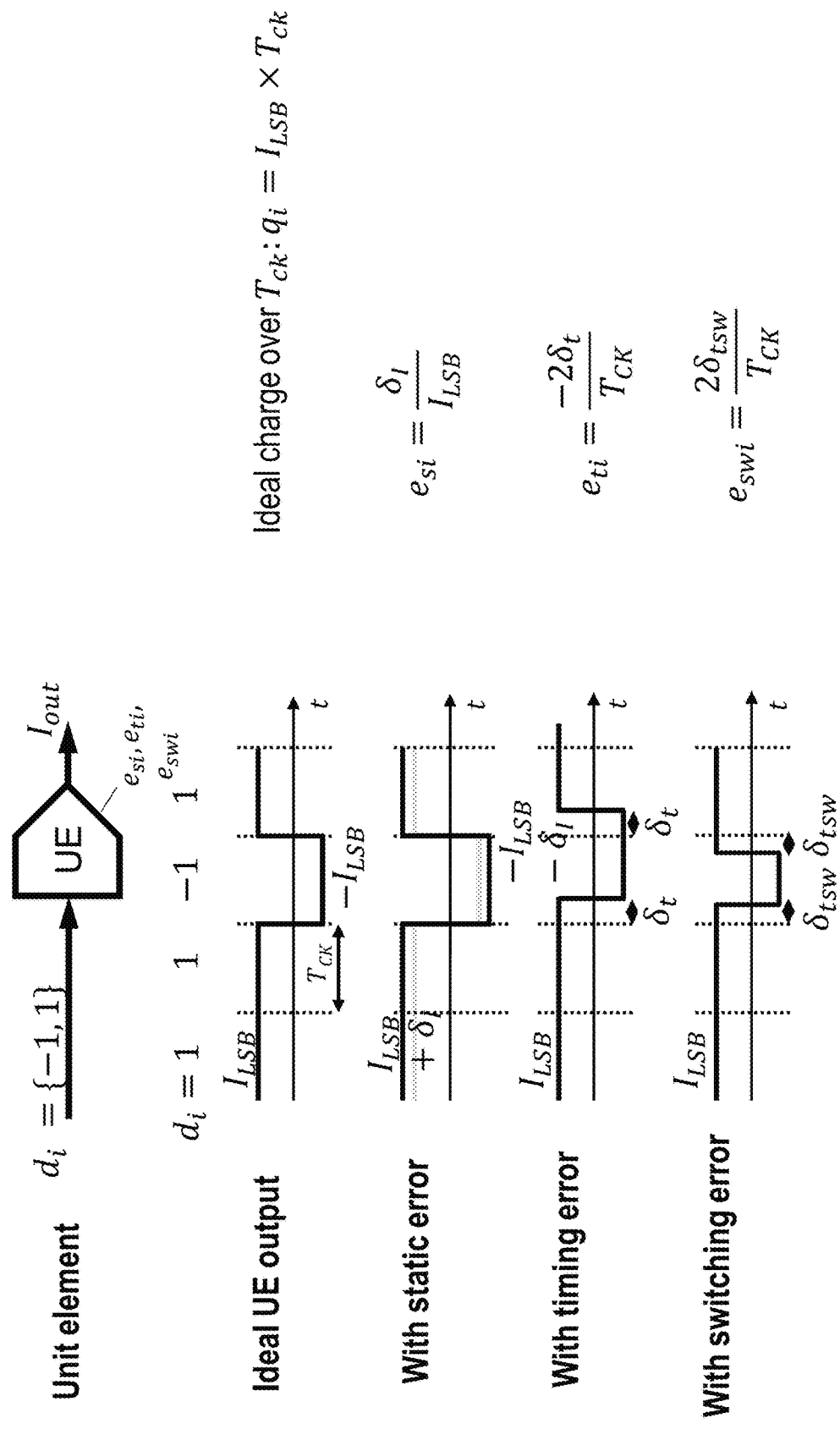
FIG. 5A illustrates modeling of a UE output current in the presence of mismatch errors, according to some embodiments of the present disclosure.
Figure 5B:
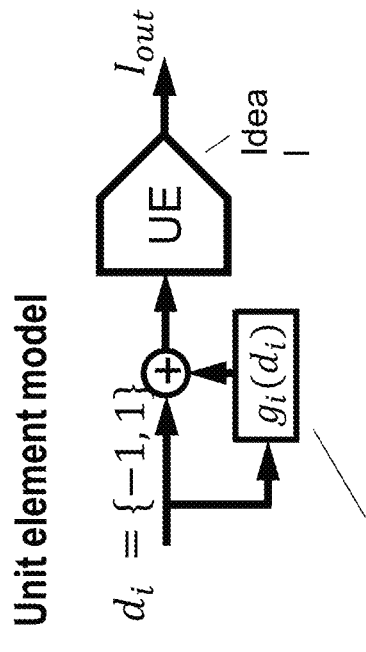
FIG. 5B illustrates a UE error model corresponding to modeling of a UE output current in the presence of mismatch errors as shown in FIG. 5A, according to some embodiments of the present disclosure.

Turning, first, to the mismatch error model of an individual UE 204 as shown in FIG. 3, such a UE may produce an output current of $\pm I_{LSB}$ for one clock period, $T_{ck}$, corresponding to its input $d_i[n]=\pm1$. The ideal charge integrated over $T_{ck}$ is $\pm I_{LSB}T_{ck}$. With mismatch, there are deviations in this charge, the deviations representing the UE errors, illustrated in FIG. 5A. Resistor mismatch affects the UE's output current and results in a "static" error, $e_{si}$. Driver and switch mismatch cause dynamic errors which include a "timing" error, $e_{ti}$, due to a time shift, and pulse-width errors cause a "switching" error, $e_{swi}$. In the notation of the errors $e_{si}$, $e_{ti}$, and $e_{swi}$, the subscript i represents that the errors are for a $UE_i$ of one of the M sub-DAC units 202. Using errors as defined in this manner, a $UE_i$ may be modeled with errors as an ideal one that receives $d_i$ and an additional "distorted" input:

$$g_i(d_i)=e_{si}d_i[n]+e_{ti}(d_i[n]-d_i[n-1])+0.5e_{swi}(1-d_i[n])d_i[n-1]),$$

as illustrated in FIG. 5B. Such a model assumes that the UE output depends only on the current and preceding digital inputs. It provides a low-frequency approximation that matches the integrated charge delivered over $T_{ck}$ with that of the non-ideal UE. The reliability of the model has been confirmed through multiple generations of CT ADC designs. The error estimates $\hat{e}_{si}$, $\hat{e}_{ti}$, $\hat{e}_{swi}$ may then be used by the error correction circuit 403 to reduce or eliminate the corresponding errors from the ADC output 428.

Turning, next, to DAC error extraction, various approaches to DAC error extraction have been suggested in the past in the context of CT DSM and stand-alone DACs. These methods involve application of a pseudo-random bit sequence (PRBS) to the UEs 204 and cross-correlation with the backend-ADC output. These methods cannot be directly applied to the CT ADCs because they give errors convolved with the impulse response of the transfer function from the sub-DAC input to the backend-ADC's (reconstructed) output, require extra processing for separation, and because switching error is not extracted.

In contrast to these conventional approaches, methods for extracting the errors for a CT ADC are described herein. In particular, a foreground extraction method and a background extraction method are described.

Figure 6A:
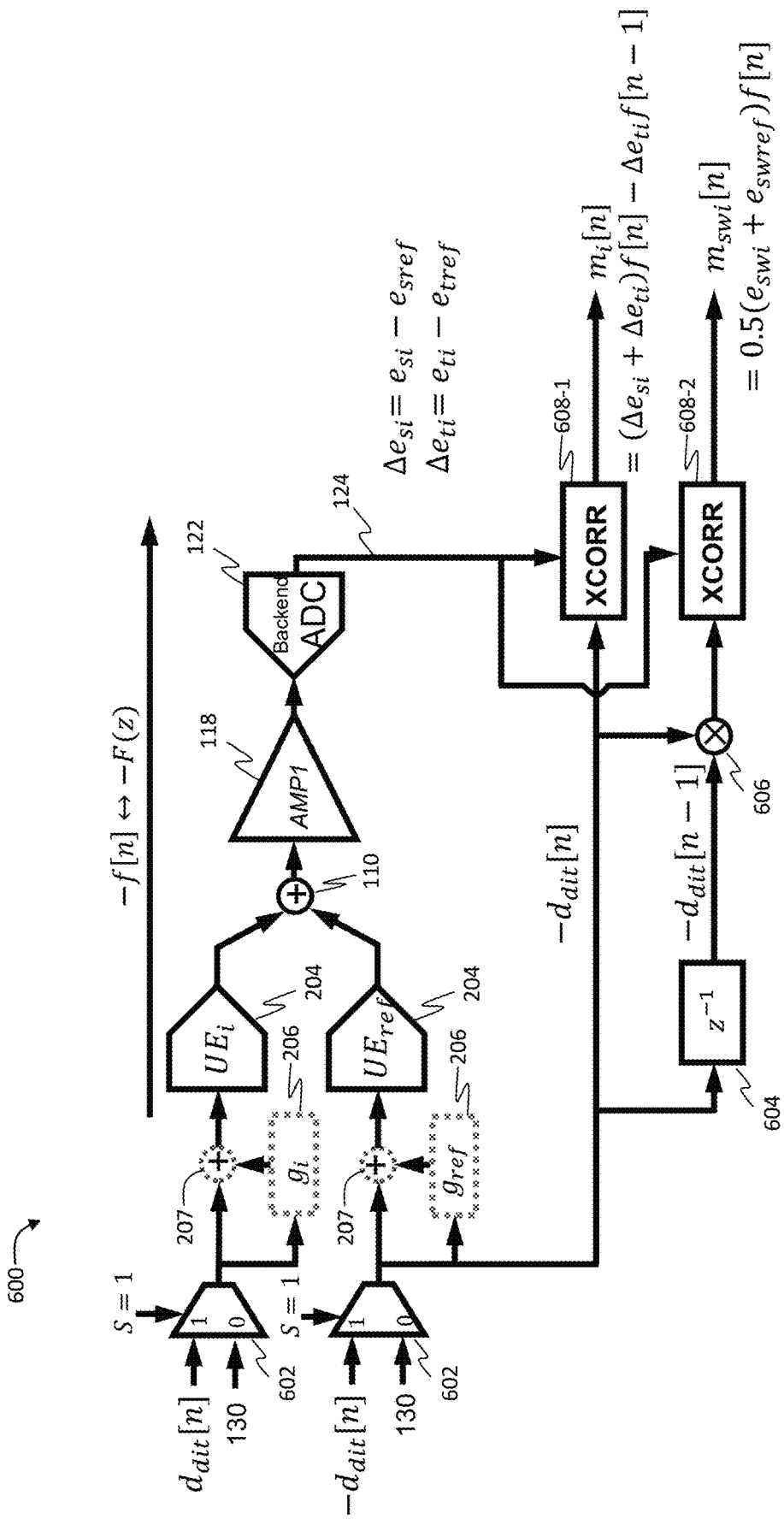

FIGS. 6A and 6B illustrate a foreground extraction approach for determining DAC errors, according to some embodiments of the present disclosure, where FIG. 6A illustrates a DAC error extraction arrangement 600, while FIG. 6B illustrates measurements and extracted errors that may be realized using the DAC error extraction arrangement 600. As shown in FIG. 6A, the DAC error extraction arrangement 600 includes some components of the CT ADC 400, shown with the same reference numerals as those shown in FIG. 4. Description of these components provided above are applicable to FIG. 6A and are not repeated here, and only additional features of the DAC error extraction arrangement 600 are described.

In some embodiments, steps of a foreground DAC error extraction method implemented by the DAC error extraction arrangement 600 may be as follows:

1. Make the CT ADC input zero (e.g., disable the input signal 102 or interrupt provision of the input signal 102 to the CT ADC 400). Set the output 130 of the sub-ADC 104 to mid-code so that half the sub-DAC elements (e.g., UEs 204) have $d_i=1$ and the other half have $d_i=-1$. The sub-DAC output signal 114 of the sub-DAC 106 is thus approximately zero.
2. Choose one of the UEs 204 as a reference, $UE_{ref}$ (shown in FIG. 6A). Another one of the UEs 204, $UE_i$ (also shown in FIG. 6A), will be the UE 204 for which the measurements are performed.
3. Bypass the output 130 of the sub-ADC 104 via multiplexers 602 (shown in FIG. 6A) and apply a PRBS sequence $-d_{dit}$ to $UE_{ref}$ and $+d_{dit}$ (i.e., a complementary PRBS sequence) to $UE_i$ (thus, a differential PRBS sequence is applied to $UE_{ref}$ and $UE_i$). The sub-DAC output signal 114 of the sub-DAC 106 remains small (ideally about zero) as only the error differences of the two UEs are injected into the backend, and there is no overload.
4. Cross-correlate the output 124 of the backend-ADC 122 with:
   a. $-d_{dit}$, using a cross-correlator 608-1 (shown in FIG. 6A), to get a multi-tap output (i.e., output of the cross-correlator 608-1 of FIG. 6A), $m_i[n]$, shown in FIG. 6B, which provides $\Delta e_{si}$ and $\Delta e_{ti}$ (i.e., the respective differences in the static and timing errors of $UE_i$ relative to $UE_{ref}$), entangled with f[n], and
   b. $d_{dit}[n] \times d_{dit}[n-1]$, using a delay unit 604, a multiplier 606, and a cross-correlator 608-2 (also shown in FIG. 6A), to get $m_{swi}[n]$ (i.e., output of the cross-correlator 608-2 of FIG. 6A), shown in FIG. 6B, which provides $e_{swi}$, also entangled with f[n] and $e_{swref}$, $UE_{ref}$'s switching error. The delay unit 604 may be configured to introduce a delay by one sample (e.g., it takes an input $-d\_dit[n]$ and generates $-d\_dit[n-1]$, which is $-d\_dit$ delayed by one sample).
5. To eliminate offsets, repeat step 4 with flipped inputs: $+d_{dit}$ to $UE_{ref}$ and $-d_{dit}$ to $UE_i$ to reobtain $m_i$ and $m_{swi}$. Set their final values to the average of these and those found in step 4.
6. Repeat steps 3-5 for all UEs.
7. f[n] is known through DRF calibration according to any known methods. To eliminate $e_{swref}$, note that the switching errors across enough UEs should have a zero-mean value. As a result, $\Delta e_{si}$, $\Delta e_{ti}$, and $e_{swi}$ may be computed as shown in FIG. 6B.
8. Optionally, to remove residual dependence of $e_{swi}$ on $e_{swref}$, a different $UE_{ref}$ may be selected and steps 3-6 may be repeated to re-extract $e_{swi}$. The final $e_{swi}$ estimate may then be the average of this and that found in step 7.

The measurements done as part of the foreground extraction and the post-processing to derive the actual relative errors are shown in FIG. 6B. With this approach, static and timing errors are obtained relative to $UE_{ref}$. In the correction logic, the coefficients $g_{ref}$ for $UE_{ref}$ may be assumed 0 and extracted relative errors are used for other UEs. This ensures that all UEs match to $UE_{ref}$. Mean shifts in the errors do not introduce distortion but can cause quantization error leakage. These can be corrected as part of the DRF calibration. For example, these may involve either shifting all UE correction coefficients together to match the PRBS DAC slice used for DRF estimation or by performing a deconvolution-based correction of the estimated DRF and applying correction in the digital path of the PRBS signal used for DRF estimation.

Figure 7:
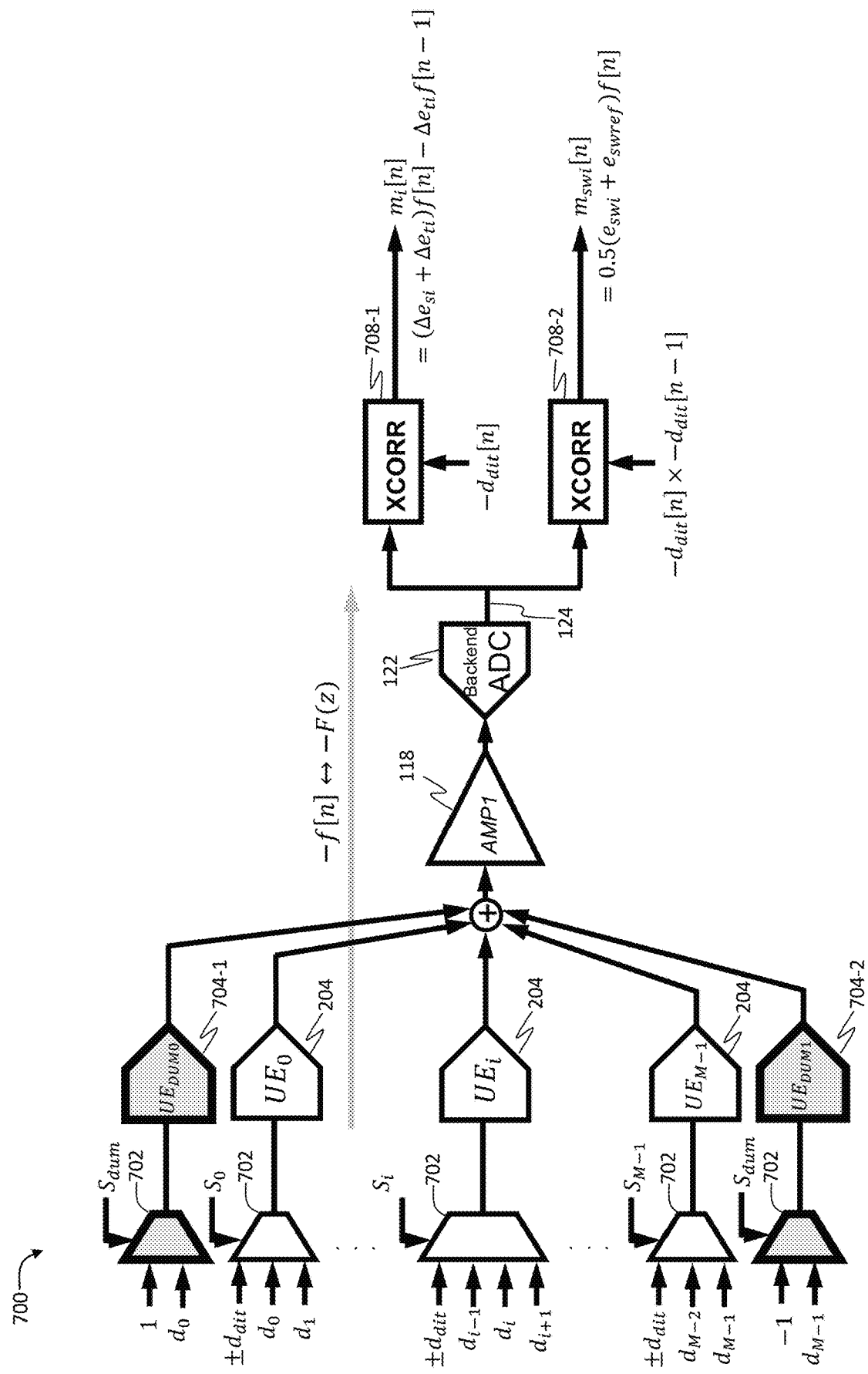
FIG. 7 illustrates a background extraction approach for determining DAC errors, according to some embodiments of the present disclosure.

The foreground extraction of DAC errors may take a relatively long time (e.g., about half a second), may need to be repeated occasionally, and requires the input signal 102 to be disabled. This can be inconvenient in some applications. Therefore, a background extraction approach for determining DAC errors is also proposed herein, as illustrated in FIG. 7. In particular, FIG. 7 illustrates a DAC error extraction arrangement 700 that includes some components of the CT ADC 400, shown with the same reference numerals as those shown in FIG. 4. Description of these components provided above are applicable to FIG. 7 and are not repeated here, and only additional features of the DAC error extraction arrangement 700 are described.

In contrast to the foregoing extraction approach, the background extraction work without any restrictions on the input conditions. The foreground approach presented herein is based on taking two UEs 204—one being the reference and the other being the UE whose errors are being estimated—and applying a differential PRBS sequence to them, followed by performing cross correlations to extract the errors. However, taking two UEs 204 of the CT ADC 400 offline partially breaks the feedforward path and, if the input signal 102 is applied, as it would be in normal operation, it may result in a large quantization error and may overload the backend-ADC 122.

To resolve this, the DAC error extraction arrangement 700 as shown in FIG. 7 may be used, where two dummy UEs are added to the set of M UEs 204 of the CT ADC 400, shown as a first dummy UE 704-1 ($UE_{DUM0}$, shown in FIG. 7) and a second dummy UE 704-2 ($UE_{DUM1}$, shown in FIG. 7). As shown in FIG. 7, the DAC error extraction arrangement 700 further includes a respective selection multiplexer 702 associated with each of the UEs 204 and the dummy UEs 704, where the selection multiplexers 702 associated with the UEs 204 are controlled by a control signal $S_i$ for the respective $UE_i$ 204, and the selection multiplexers 702 associated with the dummy UEs 704 are controlled by a control signal $S_{dum}$.

The foregoing DAC error extraction may then be performed as follows. As shown in FIG. 7, each UE 204 of the sub-DAC 106 is configured to receive, in addition to its regular digital input $d_i$, those of its adjacent UEs 204 and the PRBS sequence $\pm d_{dit}$. For instance, $UE_i$ can receive, in addition to $d_i$, bits $d_{i-1}$, $d_{i+1}$, and $\pm d_{dit}$. These inputs are passed through a selection multiplexer 702 controlled by a control signal $S_i$. Now when $UE_i$ is taken offline for error extraction, its input $d_i$ is passed to $UE_{i+1}$, whose input $d_{i+1}$, in turn, is fed to $UE_{i+2}$; this is repeated until the UE 204 on the extreme end, $UE_{M-1}$, is reached. To handle its input $d_{M-1}$, the second dummy UE 704-2 ($UE_{DUM1}$ in FIG. 7) may be used. The input of the reference UE, $UE_{ref}$, is shifted in the array in a similar manner, but in the opposite direction. On the other end, the input, $d_0$, of $UE_0$ is fed into the first dummy UE 704-1 ($UE_{DUM0}$ in FIG. 7). In this manner, effectively, the two dummy UEs 704, $UE_{DUM0}$ and $UE_{DUM1}$, compensate for the loss of the two UEs 204 being taken offline for the error extraction. During normal operation, they may respectively take +1 and −1 digital inputs, so that their summed output injected into the backend would, ideally, be substantially equal to zero. During calibration, the selection multiplexers 702 associated with the dummy UEs 704 are controlled by the control signal $S_{dum}$ to provide digital inputs $d_0$ and $d_{M-1}$ to, respectively, the first and the second dummy UEs 704. This may help ensure that the continuity of the feedforward path of the CT ADC 400 is maintained. Thus, normal operation with the input signal 102 being applied may continue. The errors contributed by the two dummy UEs 704 should be less detrimental if the remaining UEs 204 match. If that is not the case, they too can be calibrated using a similar approach.

With this set up, any two UEs 204 can be taken offline for error extraction (controlled via $S_i$), injected with $\pm d_{dit}$ signal, and their relative errors can be extracted using cross-correlation exactly as described for the foreground method. The same measurements and extraction computations as shown in FIG. 6B may be realized in this manner, except that, for the background approach, the measurements and the errors as shown in FIG. 6B may be obtained while the input signal 102 is applied to the CT ADC 400.

It should be noted that data shifting is possible in either direction. This allows any UE 204 to be defined as the reference, and depending on the UE 204 being measured, the direction of the data shift can be determined. Since the shift is limited to only the adjacent UEs 204, routing complexity and additional delays may be reduced or minimized. This approach is in contrast to some conventional approaches for stand-alone DACs, where all DAC input bits are routed to a single UE.

The power and area overheads for the foreground and background methods as described herein may be about the same.

Digital correction of DAC errors in CT ADCs as proposed herein may be used in any CT residue generation system, which may be a part of CTP ADCs, CT MASH, and VCO-based, sigma-delta ($\Delta\Sigma$) ADCs.

Figure 8A:
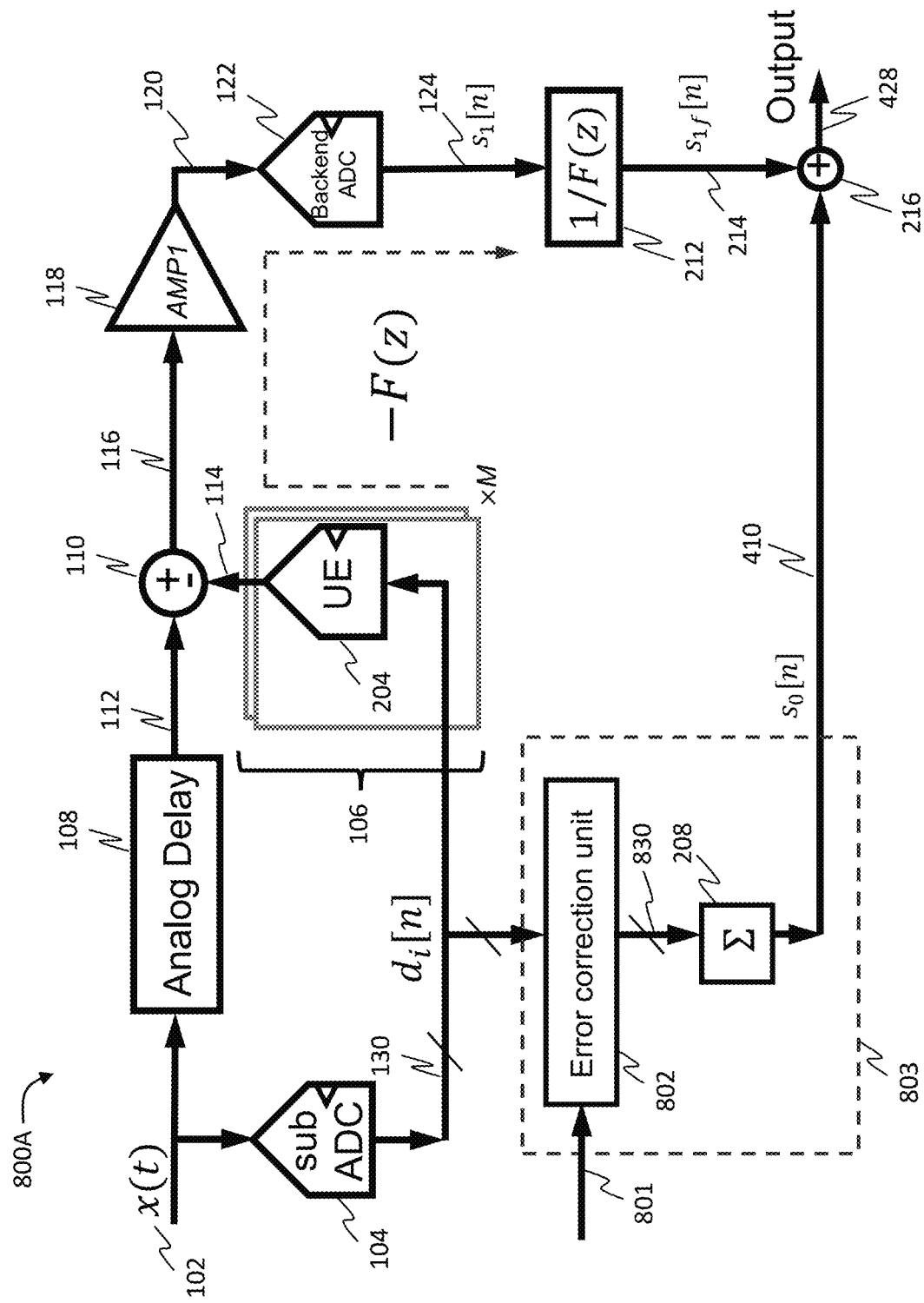
FIG. 8A provides a schematic illustration of a CT ADC configured to implement digital correction of DAC errors, according to some embodiments of the present disclosure.

FIG. 8A illustrates DAC error correction in a CT ADC implementing digital correction of DAC errors in its broad representation, illustrating a CT ADC 800 that is similar to that shown in FIG. 4, except that the error correction unit 402 and the error correction circuit 403 that were included in FIG. 4 are now replaced with, respectively, an error correction unit 802 (which is a general representation of, and is analogous to, the error correction unit 402) and an error correction circuit 803 (which is a general representation of, and is analogous to, the error correction circuit 403), representing digital hardware that digitally corrects the sub-DAC errors as described herein. Thus, the error correction unit 402, described above, is one example of the error correction unit 802 of FIG. 8A, and the error correction circuit 403, described above, is one example of the error correction circuit 803 of FIG. 8A.

Modeling of the sub-DAC mismatch errors has been described above. The correction hardware implemented in the error correction circuit 803 can be further extended to implement multi-tap polynomial equations. For instance, instead of a two-tap correction using $d_i$ signals and a single-tap correction using the switching sequence ($d_i[n]d_i[n-1]$), the error correction circuit 803 may implement:

$$\hat{g}_i = \sum_{i=0}^{M-1} \sum_{k=0}^{L} \{a_k d_i[n-k] + b_k T_i[n-k]\}$$

where M is the number of sub-DAC UEs 204, L represents the number of correction taps, $a_k$ and $b_k$ represent the correction coefficients, and $T_i[n]=d_i[n] \times d_i[n-1]$ represents the switching sequence.

The sub-DAC also introduces errors dependent on its net binary input signal, $S_F[n]$, and its absolute value $|S_F[n]|$. These can be added to the error correction circuit 803 as L-tap correction terms:

$$\hat{g}_i = \sum_{i=0}^{M-1} \sum_{k=0}^{L} \{a_k d_i[n-k] + b_k T_i[n-k]\} + \sum_{k=0}^{L} \{c_k S_F[n-k] + d_k |S_F[n-k]|\},$$

where $\{c_k, d_k\}$ represent the correction coefficients.

Finally, it is possible to extend each of the variables in this correction term to include higher order polynomials. The broadest mathematical representation of the error correction circuit 803 including such higher terms is shown below:

$$\hat{g}_i = \sum_{i=0}^{M-1} \sum_{p=0}^{N_0} \sum_{k=0}^{L_0} \{a_{pk} d_i^p[n-k]\} \leftarrow UE \text{ input data} +$$

$$\sum_{i=0}^{M-1} \sum_{p=0}^{N_1} \sum_{k=0}^{L_1} \{b_{pk} T_i^p[n-k]\} \leftarrow UE \text{ input transition data},$$

$$T_i[n] = d_i[n] \times d_i[n-1] +$$

$$\sum_{p=0}^{N_2} \sum_{k=0}^{L_2} \{c_{pk} S_F^p[n-k]\} \leftarrow Sub\text{-}DAC \text{ input binary data},$$

$$S_F[n] = \sum_{i=0}^{M-1} \{d_i[n]\} +$$

$$\sum_{p=0}^{N_3} \sum_{k=0}^{L_3} \{d_{pk} |S_F[n-k]|^p\} \leftarrow$$

Absolute value of *sub–DAC* input binary data

Figure 8B:
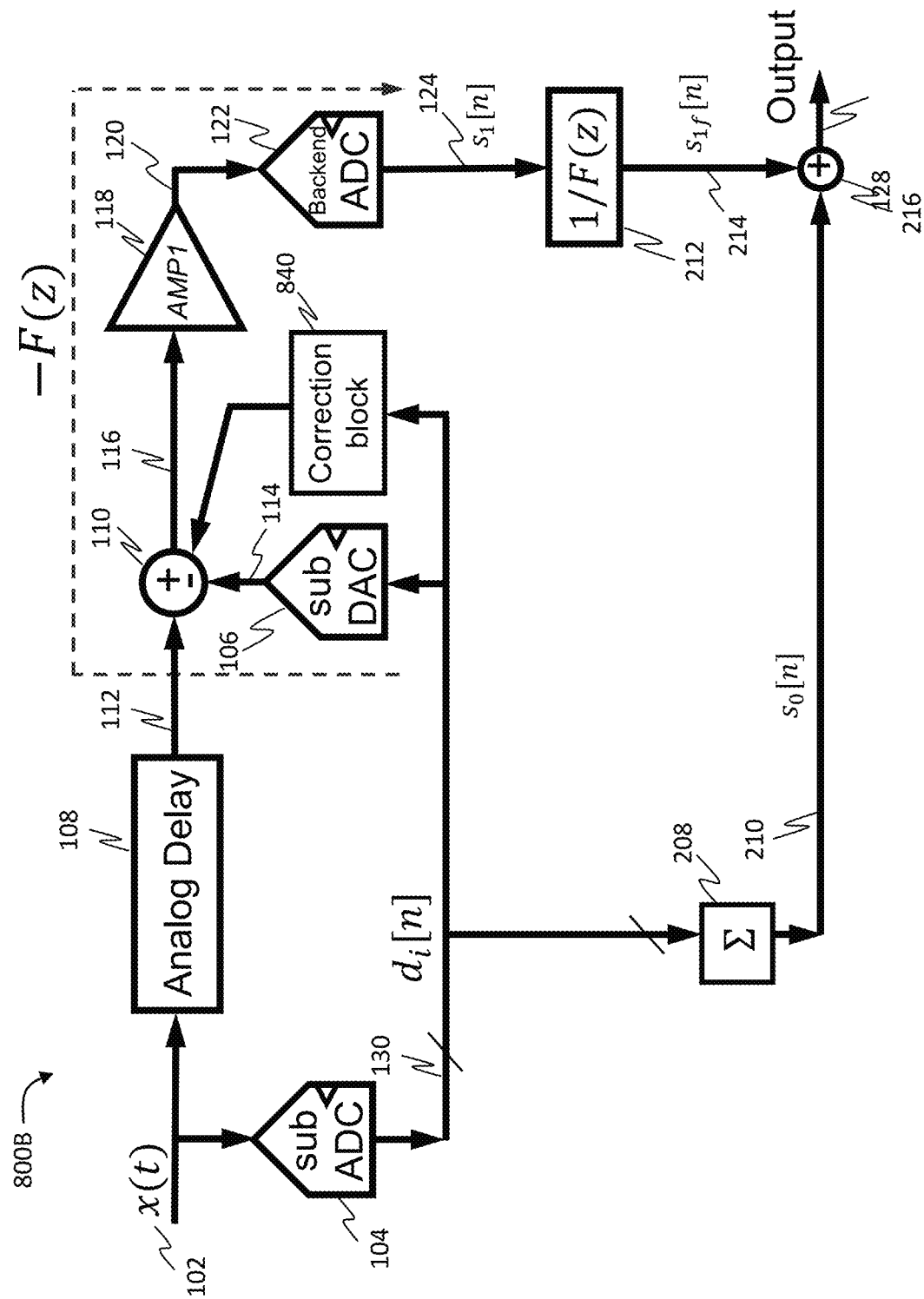
FIG. 8B provides a schematic illustration of a CT ADC configured to implement analog correction of DAC errors.

In contrast, FIG. 8B provides a schematic illustration of a CT ADC 800B configured to implement analog correction of DAC errors, according to some conventional implementations. As shown in FIG. 8B, an error correction block 840 is configured to receive as an input, the digital signal 130, and provide its output to the combiner 110, thus by-passing the sub-DAC 106.

ADCs configured to implement digital correction of DAC errors according to various embodiments described herein may be implemented in a multitude of various electronic devices. One frequent, non-limiting, example of electronic devices in which such ADCs may be implemented are RF devices.

Figure 9:
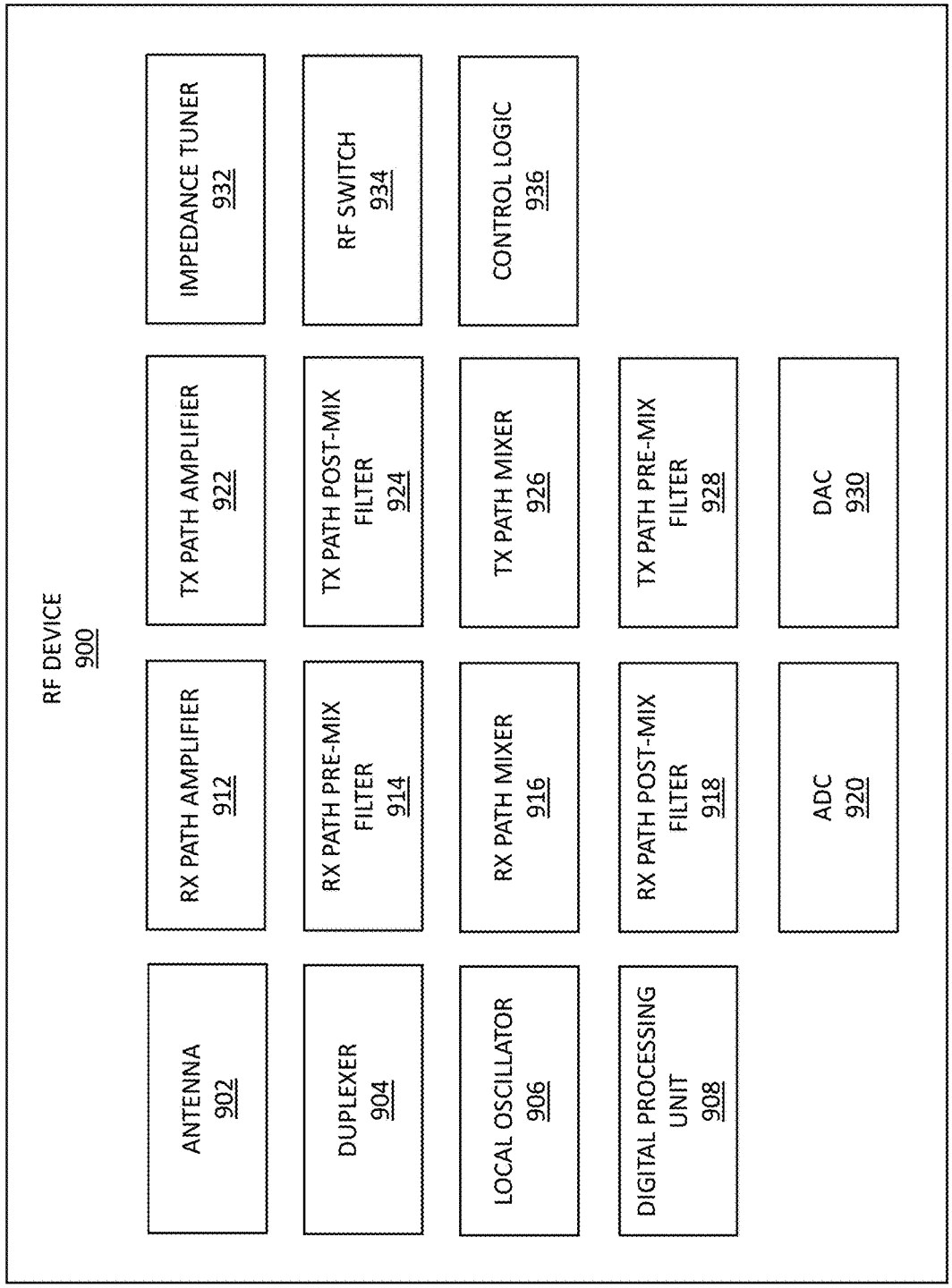
FIG. 9 provides a block diagram illustrating a radio frequency (RF) device in which a CT ADC with digital correction of DAC errors may be implemented, according to some embodiments of the present disclosure.

RF devices are devices that transmit and receive signals in the form of electromagnetic waves in the RF range of approximately 3 kilohertz (kHz) to 300 gigahertz (GHz). RF devices are commonly used for a large variety of applications such as wired and wireless communications, automotive radar, industrial radar, medical applications, or military applications, with cellular/wireless mobile technology (i.e., wireless communications) being a prominent example. In some embodiments, while not limited to, ADCs with residue generation arrangements with digital correction of DAC errors as disclosed herein may be included in various RF devices and systems used in wireless communications. For example, ADCs with digital correction of DAC errors as disclosed herein may be particularly beneficial for use in fifth generation (5G) wireless communications, e.g., in millimeter-wave (mm-wave) or sub-6 GHz, applications. For illustration purposes only, one example RF device that may include any of the ADCs or residue generation arrangements with digital correction of DAC errors as disclosed herein is shown in FIG. 9 and described below. However, in general, ADCs and residue generation arrangements with digital correction of DAC errors as disclosed herein may be included in other RF devices and systems, all of which being within the scope of the present disclosure.

FIG. 9 provides a schematic block diagram illustrating an RF device in which an ADC or a residue generation arrangement with digital correction of DAC errors may be implemented, according to some embodiments of the present disclosure.

In general, the RF device 900 may be any device or system that may support wireless transmission and/or reception of signals in the form of electromagnetic waves in the RF range of approximately 3 kHz to approximately 300 GHz. In some embodiments, the RF device 900 may be used for wireless communications, e.g., in a base station (BS) or a user equipment device of any suitable cellular wireless communications technology, such as GSM, WCDMA, or LTE. In a further example, the RF device 900 may be used as, or in, e.g., a BS or a UE device of a mm-wave wireless technology such as 5G wireless (i.e., high-frequency/short-wavelength spectrum, e.g., with frequencies in the range between about 20 and 60 GHz, corresponding to wavelengths in the range between about 5 and 15 millimeters). In yet another example, the RF device 900 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 900 may be used for wireless communications using Bluetooth technology (e.g., a frequency band from about 2.4 to about 2.485 GHz, corresponding to a wavelength of about 12 cm). In other embodiments, the RF device 900 may be used for transmitting and/or receiving RF signals for purposes other than communication, e.g., in an automotive radar system, or in medical applications such as MRI.

In various embodiments, the RF device 900 may be included in frequency-domain duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 9 as included in the RF device 900, but any one or more of these components may be omitted or duplicated, as suitable for the application. For example, in some embodiments, the RF device 900 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 900 may be an RF device supporting only wireless reception (e.g., an RF receiver), in which case it may include the components of the RX path, but not the components of the TX path; or the RF device 900 may be an RF device supporting only wireless transmission (e.g., an RF transmitter), in which case it may include the components of the TX path, but not the components of the RX path.

In some embodiments, some or all the components included in the RF device 900 may be attached to one or more motherboards. In some embodiments, some or all these components are fabricated on a single die, e.g., on a single system on chip (SOC) die.

Additionally, in various embodiments, the RF device 900 may not include one or more of the components illustrated in FIG. 9, but the RF device 900 may include interface circuitry for coupling to the one or more components. For example, the RF device 900 may not include a digital processing unit 908 but may include interface circuitry (e.g., connectors and supporting circuitry) to which the digital processing unit 908 may be coupled. In another example, the RF device 900 may not include a local oscillator 906, but may include interface circuitry (e.g., connectors and supporting circuitry) to which the local oscillator 906 may be coupled.

As shown in FIG. 9, the RF device 900 may include an antenna 902, a duplexer 904 (e.g., if the RF device 900 is an FDD RF device; otherwise the duplexer 904 may be omitted), a local oscillator 906, a digital processing unit 908. As also shown in FIG. 9, the RF device 900 may include an RX path that may include an RX path amplifier 912, an RX path pre-mix filter 914, a RX path mixer 916, an RX path post-mix filter 918, and an ADC 920. As further shown in FIG. 9, the RF device 900 may include a TX path that may include a TX path amplifier 922, a TX path post-mix filter 924, a TX path mixer 926, a TX path pre-mix filter 928, and a DAC 930. Still further, the RF device 900 may further include an impedance tuner 932, an RF switch 934, and control logic 936. In various embodiments, the RF device 900 may include multiple instances of any of the components shown in FIG. 9. In some embodiments, the RX path amplifier 912, the TX path amplifier 922, the duplexer 904, and the RF switch 934 may be considered to form, or be a part of, an RF front-end (FE) of the RF device 900. In some embodiments, the RX path amplifier 912, the TX path amplifier 922, the duplexer 904, and the RF switch 934 may be considered to form, or be a part of, an RF FE of the RF device 900. In some embodiments, the RX path mixer 916 and the TX path mixer 926 (possibly with their associated pre-mix and post-mix filters shown in FIG. 9) may be considered to form, or be a part of, an RF transceiver of the RF device 900 (or of an RF receiver or an RF transmitter if only RX path or TX path components, respectively, are included in the RF device 900). In some embodiments, the RF device 900 may further include one or more control logic elements/circuits, shown in FIG. 9 as control logic 936, e.g., an RF FE control interface. In some embodiments, the control logic 936 may be used to perform functions such as enhance control of complex RF system environment, support implementation of envelope tracking techniques, or reduce dissipated power within the RF device 900. In some embodiments, the control logic 936 may be used to perform, or control implementation of, digital correction of DAC errors as described herein.

The antenna 902 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 900 is an FDD transceiver, the antenna 902 may be configured for concurrent reception and transmission of communication signals in separate, i.e., non-overlapping and non-continuous, bands of frequencies, e.g., in bands having a separation of, e.g., 20 MHz from one another. If the RF device 900 is a TDD transceiver, the antenna 902 may be configured for sequential reception and transmission of communication signals in bands of frequencies that may be the same or overlapping for TX and RX paths. In some embodiments, the RF device 900 may be a multi-band RF device, in which case the antenna 902 may be configured for concurrent reception of signals having multiple RF components in separate frequency bands and/or configured for concurrent transmission of signals having multiple RF components in separate frequency bands. In such embodiments, the antenna 902 may be a single wideband antenna or a plurality of band-specific antennas (i.e., a plurality of antennas each configured to receive and/or transmit signals in a specific band of frequencies). In some embodiments, the RF device 900 may include more than one antenna 902 to implement antenna diversity. In some such embodiments, the RF switch 934 may be deployed to switch between different antennas.

An output of the antenna 902 may be coupled to the input of the duplexer 904. The duplexer 904 may be any suitable component configured for filtering multiple signals to allow for bidirectional communication over a single path between the duplexer 904 and the antenna 902. The duplexer 904 may be configured for providing RX signals to the RX path of the RF device 900 and for receiving TX signals from the TX path of the RF device 900.

The RF device 900 may include one or more local oscillators 906, configured to provide local oscillator signals that may be used for downconversion of the RF signals received by the antenna 902 and/or upconversion of the signals to be transmitted by the antenna 902.

The RF device 900 may include the digital processing unit 908, which may include one or more processing devices. The digital processing unit 908 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 900 may further include a memory device, configured to cooperate with the digital processing unit 908.

Turning to the details of the RX path that may be included in the RF device 900, the RX path amplifier 912 may include a low-noise amplifier (LNA). An input of the RX path amplifier 912 may be coupled to an antenna port (not shown) of the antenna 902, e.g., via the duplexer 904. The RX path amplifier 912 may amplify the RF signals received by the antenna 902.

An output of the RX path amplifier 912 may be coupled to an input of the RX path pre-mix filter 914, which may be a harmonic or band-pass (e.g., low-pass) filter, configured to filter received RF signals that have been amplified by the RX path amplifier 912.

An output of the RX path pre-mix filter 914 may be coupled to an input of the RX path mixer 916, also referred to as a downconverter. The RX path mixer 916 may include two inputs and one output. A first input may be configured to receive the RX signals, which may be current signals, indicative of the signals received by the antenna 902 (e.g., the first input may receive the output of the RX path pre-mix filter 914). A second input may be configured to receive local oscillator signals from one of the local oscillators 906. The RX path mixer 916 may then mix the signals received at its two inputs to generate a downconverted RX signal, provided at an output of the RX path mixer 916. As used herein, downconversion refers to a process of mixing a received RF signal with a local oscillator signal to generate a signal of a lower frequency. In particular, the TX path mixer (e.g., downconverter) 916 may be configured to generate the sum and/or the difference frequency at the output port when two input frequencies are provided at the two input ports. In some embodiments, the RF device 900 may implement a direct-conversion receiver (DCR), also known as homodyne, synchrodyne, or zero-IF receiver, in which case the RX path mixer 916 may be configured to demodulate the incoming radio signals using local oscillator signals whose frequency is identical to, or very close to the carrier frequency of the radio signal. In other embodiments, the RF device 900 may make use of downconversion of the RX signals to an intermediate frequency (IF), before downconversion to the baseband. IF may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 916 and/or the TX path mixer 926 may include several such stages of IF conversion.

Although a single RX path mixer 916 is shown in the RX path of FIG. 9, in some embodiments, the RX path mixer 916 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 902 and an in-phase component of the local oscillator signal provided by the local oscillator 906. The second RX path mixer may be configured for performing downconversion to generate a quadrature (Q) downconverted RX signal by mixing the RX signal received by the antenna 902 and a quadrature component of the local oscillator signal provided by the local oscillator 906 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 916 may, optionally, be coupled to the RX path post-mix filter 918, which may be low-pass filters. In case the RX path mixer 916 is a quadrature mixer that implements the first and second mixers as described above, the in-phase and quadrature components provided at the outputs of the first and second mixers respectively may be coupled to respective individual first and second RX path post-mix filters included in the filter 918.

The ADC 920 may be configured to convert the mixed RX signals from the RX path mixer 916 from analog to digital domain. The ADC 920 may be a quadrature ADC that, like the RX path quadrature mixer 916, may include two ADCs, configured to digitize the downconverted RX path signals separated in in-phase and quadrature components. The output of the ADC 920 may be provided to the digital processing unit 908, configured to perform various functions related to digital processing of the RX signals so that information encoded in the RX signals can be extracted. The ADC 920 may include any embodiment of the ADCs with digital correction of DAC errors as described herein.

Turning to the details of the TX path that may be included in the RF device 900, the digital signal to later be transmitted (TX signal) by the antenna 902 may be provided, from the digital processing unit 908, to the DAC 930. Like the ADC 920, the DAC 930 may include two DACs, configured to convert, respectively, digital I- and Q-path TX signal components to analog form.

Optionally, the output of the DAC 930 may be coupled to the TX path pre-mix filter 928, which may be a band-pass (e.g., low-pass) filter (or a pair of band-pass, e.g., low-pass, filters, in case of quadrature processing) configured to filter out, from the analog TX signals output by the DAC 930, the signal components outside of the desired band. The digital TX signals may then be provided to the TX path mixer 926, which may also be referred to as an upconverter. Like the RX path mixer 916, the TX path mixer 926 may include a pair of TX path mixers, for in-phase and quadrature component mixing. Like the first and second RX path mixers that may be included in the RX path, each of the TX path mixers of the TX path mixer 926 may include two inputs and one output. A first input may receive the TX signal components, converted to the analog form by the respective DAC 930, which are to be upconverted to generate RF signals to be transmitted. The first TX path mixer may generate an in-phase (I) upconverted signal by mixing the TX signal component converted to analog form by the DAC 930 with the in-phase component of the TX path local oscillator signal provided from the local oscillator 906. In various embodiments, the local oscillator 906 may include a plurality of different local oscillators or be configured to provide different local oscillator frequencies for the mixer 916 in the RX path and the mixer 926 in the TX path. The second TX path mixer may generate a quadrature phase (Q) upconverted signal by mixing the TX signal component converted to analog form by the DAC 930 with the quadrature component of the TX path local oscillator signal. The output of the second TX path mixer may be added to the output of the first TX path mixer to create a real RF signal. A second input of each of the TX path mixers may be coupled the local oscillator 906. Thus, the second input of each of the TX path mixers 926 may receive a local oscillator signal to be used for the mixing (e.g., either a local oscillator signal at a frequency substantially the same to the RF carrier signal frequency for a direct conversion from baseband to RF, or a frequency that is between the baseband and the RF carrier frequency if IF conversion is used).

Optionally, the RF device 900 may include the TX path post-mix filter 924, configured to filter the output of the TX path mixer 926.

The TX path amplifier 922 may include an array of power amplifiers.

In various embodiments, any of the RX path pre-mix filter 914, the RX path post-mix filter 918, the TX post-mix filter 924, and the TX pre-mix filter 928 may be implemented as RF filters. In some embodiments, an RF filter may be implemented as a plurality of RF filters, or a filter bank. A filter bank may include a plurality of RF filters that may be coupled to a switch, e. g., the RF switch 934, configured to selectively switch any one of the plurality of RF filters on and off (e.g., activate any one of the plurality of RF filters), to achieve desired filtering characteristics of the filter bank (i.e., in order to program the filter bank). For example, such a filter bank may be used to switch between different RF frequency ranges when the RF device 900 is, or is included in, a BS or in a UE device. In another example, such a filter bank may be programmable to suppress TX leakage on the different duplex distances.

The impedance tuner 932 may include any suitable circuitry, configured to match the input and output impedances of the different RF circuitries to minimize signal losses in the RF device 900. For example, the impedance tuner 932 may include an antenna impedance tuner. Being able to tune the impedance of the antenna 902 may be particularly advantageous because antenna's impedance is a function of the environment that the RF device 900 is in, e.g., antenna's impedance changes depending on, e.g., if the antenna is held in a hand, placed on a car roof, etc.

As described above, the RF switch 934 may be a device configured to route high-frequency signals through transmission paths, e.g., in order to selectively switch between a plurality of instances of any one of the components shown in FIG. 9, e.g., to achieve desired behavior and characteristics of the RF device 900. For example, in some embodiments, an RF switch may be used to switch between different antennas 902. In other embodiments, an RF switch may be used to switch between a plurality of RF filters (e.g., by selectively switching RF filters on and off) of the RF device 900. Typically, an RF system would include a plurality of such RF switches.

The RF device 900 provides a simplified version and, in further embodiments, other components not specifically shown in FIG. 9 may be included. For example, the RX path of the RF device 900 may include a current-to-voltage amplifier between the RX path mixer 916 and the ADC 920, which may be configured to amplify and convert the downconverted signals to voltage signals. In another example, the RX path of the RF device 900 may include a balun transformer for generating balanced signals. In yet another example, the RF device 900 may further include a clock generator, which may, e.g., include a suitable phased-lock loop (PLL), configured to receive a reference clock signal and use it to generate a different clock signal that may then be used for timing the operation of the ADC 920, the DAC 930, and/or that may also be used by the local oscillator 906 to generate the local oscillator signals to be used in the RX path or the TX path.

Figure 10:
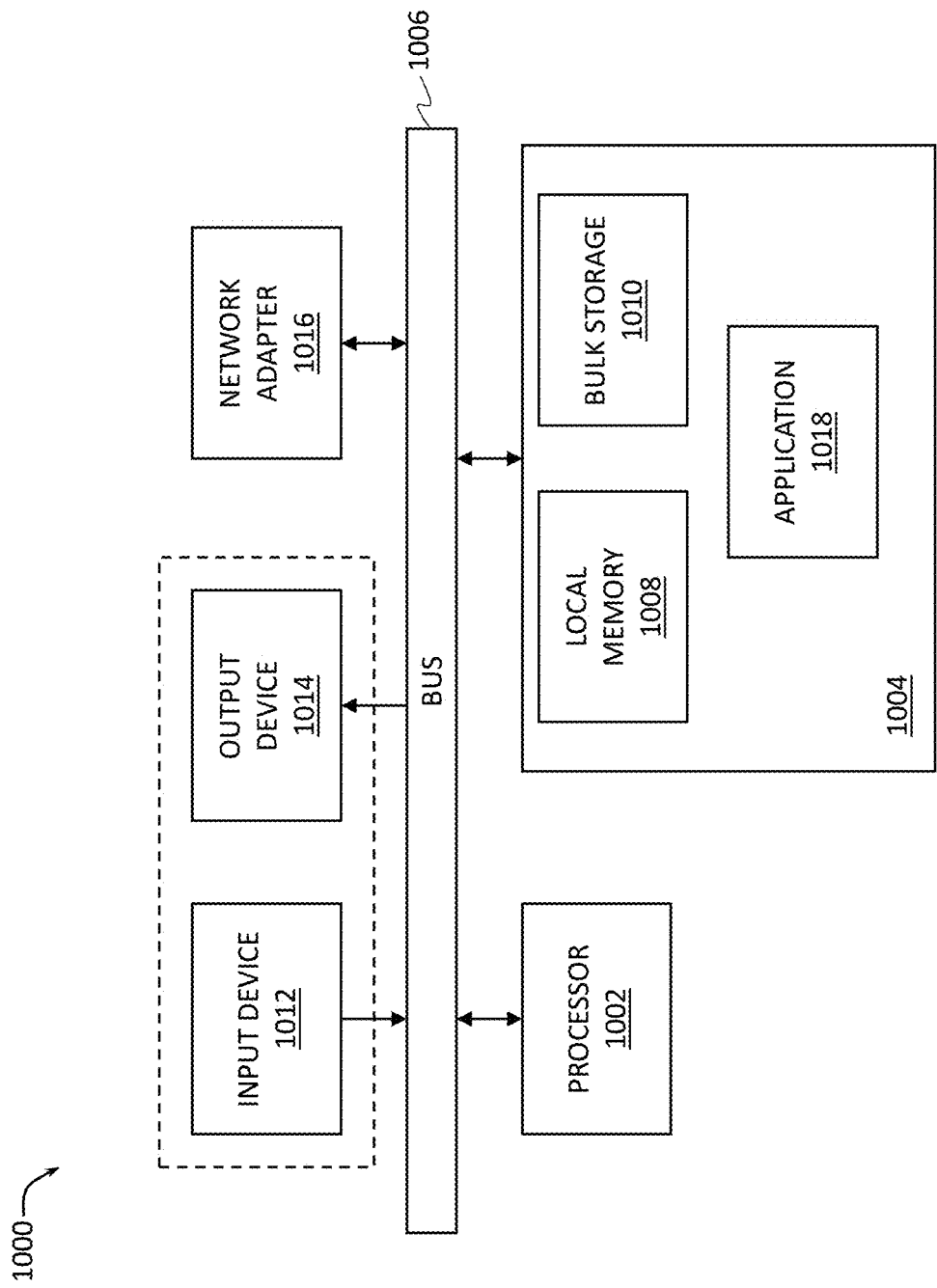
FIG. 10 provides a block diagram illustrating an example data processing system that may be configured to implement, or control, at least portions of performing digital correction of DAC errors in CT ADCs, according to some embodiments of the present disclosure.

FIG. 10 provides a block diagram illustrating an example data processing system 1000 that may be configured to implement, or control, at least portions of performing digital correction of DAC errors in CT ADCs as described herein, according to some embodiments of the present disclosure. For example, the data processing system 1000 may be configured to implement or control portions of the error correction circuits 403 or 803 as described herein. In another example, the data processing system 1000 may be configured to implement or control portions of the foreground or background DAC error extraction as described herein. In still further examples, the data processing system 1000 may be configured to implement or control portions of any further embodiments of digital correction of DAC errors as described herein. In an example, the data processing system 1000 may be configured to implement at least portions of the control logic 936, shown in FIG. 9.

As shown in FIG. 10, the data processing system 1000 may include at least one processor 1002, e.g., a hardware processor 1002, coupled to memory elements 1004 through a system bus 1006. As such, the data processing system may store program code within memory elements 1004. Further, the processor 1002 may execute the program code accessed from the memory elements 1004 via a system bus 1006. In one aspect, the data processing system may be implemented as a computer that is suitable for storing and/or executing program code. It should be appreciated, however, that the data processing system 1000 may be implemented in the form of any system including a processor and a memory that is capable of performing the functions described within this disclosure.

In some embodiments, the processor 1002 can execute software or an algorithm to perform the activities as discussed in the present disclosure, in particular activities related to implementing digital correction of DAC errors as described herein. The processor 1002 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1002 may be communicatively coupled to the memory element 1004, for example in a direct-memory access (DMA) configuration, so that the processor 1002 may read from or write to the memory elements 1004.

In general, the memory elements 1004 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1000 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating ADCs or larger electronic devices with digital correction of DAC errors as shown in FIGS. 1-9, can also include suitable interfaces for receiving, transmitting, and/or otherwise communicating data or information in a network environment so that they can communicate with, e.g., the data processing system 1000.

In certain example implementations, mechanisms performing digital correction of DAC errors as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 1004 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 1002 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1004 may include one or more physical memory devices such as, for example, local memory 1008 and one or more bulk storage devices 1010. The local memory may refer to RAM or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from the bulk storage device 1010 during execution.

As shown in FIG. 10, the memory elements 1004 may store an application 1018. In various embodiments, the application 1018 may be stored in the local memory 1008, the one or more bulk storage devices 1010, or apart from the local memory and the bulk storage devices. It should be appreciated that the data processing system 1000 may further execute an operating system (not shown in FIG. 10) that can facilitate execution of the application 1018. The application 1018, being implemented in the form of executable program code, can be executed by the data processing system 1000, e.g., by the processor 1002. Responsive to executing the application, the data processing system 1000 may be configured to perform one or more operations or method steps described herein.

Input/output (I/O) devices depicted as an input device 1012 and an output device 1014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1014 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1014. Input and/or output devices 1012, 1014 may be coupled to the data processing system either directly or through intervening I/O controllers.

In an embodiment, the input and the output devices may be implemented as a combined input/output device (illustrated in FIG. 10 with a dashed line surrounding the input device 1012 and the output device 1014). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 1016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1000, and a data transmitter for transmitting data from the data processing system 1000 to said systems, devices and/or networks. Modems, cable modems, and Ethernet cards are examples of different types of network adapter that may be used with the data processing system 1000.

The following paragraphs provide various select examples of the embodiments disclosed herein.

Example 1 provides an electronic device that includes a CT ADC as shown in FIG. 8A (or a portion thereof) that may include a CT signal applied to a sub-ADC, whose output may be fed into a sub-DAC. The input signal may also be applied to a distinct delay line whose output may be subtracted from that of the sub-DAC to generate a residue signal. The residue signal may be amplified and/or filtered and digitized by a backend-ADC. The backend-ADC output, $s_1$, may be applied to a DRF that implements the transfer function $1/F(z)$. In such an arrangement, the individual thermometer bits of the sub-ADC, $d_i$, may be summed to generate a binary signal, $s_0$, that is added to the DRF output signal, $s_{1f}$, to generate the final ADC output.

Example 2 provides an electronic device that includes a CT ADC as in example 1, where each bit, $d_i$, output by the sub-ADC may be applied to an error correction block (e.g., the error correction unit 402 or 802 as described herein) that includes a plurality of error correction blocks (e.g., the error correction blocks 404) whose outputs are summed together to generate output so. This output is then summed with the DRF output, $s_{1f}$, to generate the final ADC output.

Example 3 provides the electronic device according to examples 1 or 2, further configured to include a correction block for static and/or timing errors. Such a correction block may implement an array of finite impulse response (FIR) filters, one for each UE, operating on its input di with coefficients [esî+etî, -etî]. The correction function implemented thus is gî(di)=esî di[n]+etî($d_i[n]-d_i[n-1]$) and corrects the static and timing errors of the UEs.

Example 4 provides the electronic device according to any of the examples 1-3, further configured to perform foreground estimation of $e_{si}$ and $e_{ti}$ as described herein.

Example 5 provides the electronic device according to any of the examples 1-4, further configured to perform background estimation of $e_{si}$ and $e_{ti}$ as described herein.

Example 6 provides the electronic device according to any of the examples 1-5, where an error correction block for switching errors may implement an array of blocks, one for each UE, implementing, $0.5\hat{e}_{swi}(1-d_i[n]d_i[n-1])$.

Example 7 provides the electronic device according to any of the examples 1-6, further configured to perform foreground estimation of $e_{swi}$ as described herein.

Example 8 provides the electronic device according to any of the examples 1-7, further configured to perform background estimation of $e_{swi}$ as described herein.

Example 9 provides the electronic device according to any of the examples 1-8, further configured to implement error correction block with higher terms as described herein.

Example 10 provides the electronic device according to any of the examples 1-9, extended to an ADC with multiple non-identical or identical residue generation stages.

Example 11 provides an electronic device that includes a CT ADC that includes: a delay circuit (e.g., an analog delay circuit 108), configured to generate a delay circuit output signal by applying a delay to an analog input signal (e.g., a signal 102); a sub-ADC (e.g., a sub-ADC 104), configured to generate a sub-ADC output signal (e.g., a signal 130) based on the analog input signal; an error correction circuit (e.g., an error correction circuit 403 or 803), configured to generate a digital error-corrected signal (e.g., the error-corrected signal 410) based on the sub-ADC output signal; and a DRF combiner (e.g., a DRF combiner 216), configured to generate an ADC output signal (e.g., a signal 128) based on the digital error-corrected signal.

Example 12 provides the electronic device according to example 11, where the error correction circuit includes an error correction unit (e.g., an error correction unit 402 or 802) and at least one adder (e.g., adders 406 and/or 208), the error correction unit includes a plurality of error correction blocks (e.g., error correction blocks 404) configured to generate a plurality of digital corrections based on one or more error estimates, and the at least one adder is configured to add the plurality of digital corrections to the sub-ADC output signal to generate the digital error-corrected signal.

Example 13 provides the electronic device according to example 12, where the at least one adder includes a first adder (e.g., adder 406) and a second adder (e.g., adder 208), the first adder is configured to, for an individual bit (e.g., for each bit) of a plurality of bits of the sub-ADC output signal, add the individual bit and a corresponding one of the plurality of digital corrections to generate an individual error-corrected bit of a plurality of error-corrected bits of an error-corrected sub-ADC output signal (e.g., the error-corrected signal 430 or 830), and the second adder is configured to add the plurality of error-corrected bits to generate the digital error-corrected signal.

Example 14 provides the electronic device according to example 12, where the at least one adder includes a first adder, a second adder, and a third adder; the first adder is configured to add individual digital corrections of the plurality of digital corrections to generate a digital correction sum; the second adder is configured to add individual bits of a plurality of bits of the sub-ADC output signal to generate a sub-ADC output sum; and the third adder is configured to add the digital correction sum and the sub-ADC output sum.

Example 15 provides the electronic device according to any one of examples 12-14, where the one or more error estimates include one or more of an estimate of a static error, an estimate of a timing error, and an estimate of a switching error.

Example 16 provides the electronic device according to example 15, where the static error is an error based on device (e.g., resistor or transistor) mismatch.

Example 17 provides the electronic device according to any one of examples 15-16, where the timing error is an error based on one or more of driver mismatch or switch mismatch.

Example 18 provides the electronic device according to any one of examples 15-17, where the switching error is an error based on a pulse-width error.

Example 17 provides the electronic device according to any one of examples 12-18, where the sub-ADC output signal includes M bits, M is an integer greater than or equal to 1, the plurality of error correction blocks includes M error correction blocks, and each of the M error correction blocks corresponds to a respective one of the M bits of the sub-ADC output signal.

Example 20 provides the electronic device according to example 19, further including a sub-DAC, where the sub-DAC is to generate a sub-DAC output signal (e.g., the sub-DAC output signal 114), and the sub-DAC includes M sub-DAC units.

Example 21 provides the electronic device according to any one of examples 12-20, further including an error extraction arrangement to generate the one or more error estimates.

Example 22 provides the electronic device according to example 21, where the CT ADC further includes a backend-ADC, a sub-DAC that includes M sub-DAC units, a first cross-correlator, and a second cross-correlator, and where the error extraction arrangement is configured to generate the one or more error estimates by disabling provision of the analog input signal to the CT ADC, selecting one sub-DAC unit of the M sub-DAC units as a reference sub-DAC unit, selecting another sub-DAC unit of the M sub-DAC units as a measurement sub-DAC unit, applying a first PRBS to the reference sub-DAC unit, applying a second PRBS to the measurement sub-DAC unit, using the first cross-correlator to cross-correlate the first PRBS with an output of the backend-ADC generated when the first PRBS is applied to the reference sub-DAC and the second PRBS is applied to the measurement sub-DAC, using the second cross-correlator to cross-correlate a product of the first PRBS and a delayed first PRBS with the output of the backend-ADC generated when the first PRBS is applied to the reference sub-DAC and the second PRBS is applied to the measurement sub-DAC, and generating the one or more error estimates based on outputs of the first and second cross-correlators.

Example 23 provides the electronic device according to example 22, where the error extraction arrangement is configured to generate the one or more error estimates further by applying the second PRBS to the reference sub-DAC unit, applying the first PRBS to the measurement sub-DAC unit, using the first cross-correlator to cross-correlate the first PRBS with an output of the backend-ADC generated when the second PRBS is applied to the reference sub-DAC and the first PRBS is applied to the measurement sub-DAC, using the second cross-correlator to cross-correlate a product of the first PRBS and a delayed first PRBS with the output of the backend-ADC generated when the second PRBS is applied to the reference sub-DAC and the first PRBS is applied to the measurement sub-DAC, and generating the one or more error estimates based on outputs of the first and second cross-correlators.

Example 24 provides the electronic device according to any one of examples 22-23, where the second PRBS is a negative version of the first PRBS.

Example 25 provides the electronic device according to example 21, where the CT ADC further includes a backend-ADC, a sub-DAC that includes M+2 sub-DAC units, a first cross-correlator, and a second cross-correlator; the sub-ADC output signal includes M bits; and where the error extraction arrangement is configured to generate the one or more error estimates by selecting one sub-DAC unit of the M+2 sub-DAC units as a reference sub-DAC unit, selecting another sub-DAC unit of the M+2 sub-DAC units as a measurement sub-DAC unit, applying a first PRBS to the reference sub-DAC unit, applying a second PRBS to the measurement sub-DAC unit, using the first cross-correlator to cross-correlate the first PRBS with an output of the backend-ADC generated when the first PRBS is applied to the reference sub-DAC and the second PRBS is applied to the measurement sub-DAC, using the second cross-correlator to cross-correlate a product of the first PRBS and a delayed first PRBS with the output of the backend-ADC generated when the first PRBS is applied to the reference sub-DAC and the second PRBS is applied to the measurement sub-DAC, and generating the one or more error estimates based on outputs of the first and second cross-correlators.

Example 26 provides the electronic device according to example 25, where the second PRBS is a negative version of the first PRBS.

Example 27 provides an electronic device for assisting error correction in a CT ADC, the electronic device including means for disabling provision of an analog input signal to the CT ADC; means for selecting one sub-DAC unit of M sub-DAC units of the CT ADC as a reference sub-DAC unit; means for selecting another sub-DAC unit of the M sub-DAC units as a measurement sub-DAC unit; means for applying a first PRBS to the reference sub-DAC unit; means for applying a second PRBS to the measurement sub-DAC unit; a first cross-correlator to cross-correlate the first PRBS with an output of a backend-ADC of the CT ADC, where the output of the backend-ADC is generated when the first PRBS is applied to the reference sub-DAC and the second PRBS is applied to the measurement sub-DAC; a second cross-correlator to cross-correlate a product of the first PRBS and a delayed first PRBS with the output of the backend-ADC generated when the first PRBS is applied to the reference sub-DAC and the second PRBS is applied to the measurement sub-DAC; and means for generating one or more error estimates based on outputs of the first and second cross-correlators.

Example 28 provides the electronic device according to example 27, further including an error correction unit to use the one or more error estimates to apply error correction to an output of a sub-ADC (e.g., a sub-ADC 104) to generate an output of the error correction unit, where the output of the error correction unit is a digital signal.

Example 29 provides an electronic device for assisting error correction in a CT ADC, the electronic device including the CT ADC further includes a backend-ADC, a sub-DAC that includes M+2 sub-DAC units, a first cross-correlator, and a second cross-correlator, the sub-ADC output signal includes M bits, and means for selecting one sub-DAC unit of the M+2 sub-DAC units of the CT ADC as a reference sub-DAC unit; means for selecting another sub-DAC unit of the M+2 sub-DAC units as a measurement sub-DAC unit; means for applying a first PRBS to the reference sub-DAC unit; means for applying a second PRBS to the measurement sub-DAC unit; a first cross-correlator to cross-correlate the first PRBS with an output of a backend-ADC of the CT ADC, where the output of the backend-ADC is generated when the first PRBS is applied to the reference sub-DAC and the second PRBS is applied to the measurement sub-DAC; a second cross-correlator to cross-correlate a product of the first PRBS and a delayed first PRBS with the output of the backend-ADC generated when the first PRBS is applied to the reference sub-DAC and the second PRBS is applied to the measurement sub-DAC; and means for generating the one or more error estimates based on outputs of the first and second cross-correlators.

Example 30 provides the electronic device according to example 29, further including an error correction unit to use the one or more error estimates to apply error correction to an output of a sub-ADC (e.g., a sub-ADC 104) to generate an output of the error correction unit, where the output of the error correction unit is a digital signal.

Example 31 provides the electronic device according to any one of the preceding examples, where the electronic device is an ADC, where the delay circuit, the sub-ADC, the sub-DAC, the combiner, and the digital reconstruction circuit are included in a first stage of the ADC, and the ADC further includes a second stage, where an analog input signal for the second stage is based on the combiner output signal of the first stage, and where the digital reconstruction circuit of the first stage is configured to generate the ADC output further based on an output of a digital reconstruction circuit of the second stage.

Example 32 provides the electronic device according to any one of the preceding examples, where the electronic device is a residue generation pipelined ADC.

Example 33 provides further examples of electronic devices, ADCs, or ADC arrangements, e.g., residue generation ADCs, configured to perform digital correction of DAC errors as described herein, e.g., to perform digital correction of DAC errors according to any one of the preceding examples.

Example 34 provides a computer program product or a computer-readable storage medium, including instructions which, when executed on a processor, are configured to perform digital correction of DAC errors as described herein, e.g., to perform digital correction of DAC errors according to any one of the preceding examples.

The described techniques for generating residue signals to be provided to subsequent stages of an ADC using digital correction of DAC errors may be particularly suitable for high-speed, CT, high precision applications where residue-generating ADCs are used. While embodiments of the present disclosure were described above with references to exemplary implementations as shown in FIGS. 1-10, a person skilled in the art will realize that the various teachings described above are applicable to a large variety of other implementations. For example, some applications which can greatly benefit from implementing digital correction of DAC errors as described herein include instrumentation, testing, spectral analyzers, military purposes, radar, wired or wireless communications, mobile telephones (especially because standards continue to push for higher speed communications), and base stations.

In the discussions of the embodiments above, components of a system, such as inductors, capacitors, filters, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to providing residue generation arrangements with digital correction of DAC errors as described herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions, all of which may be provided on a single chip or a single substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-10) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular component arrangements. Various modifications and changes may be made to such embodiments without departing from the scope of the present disclosure. The description and drawings are, accordingly, to be regarded in an illustrative rather than in a restrictive sense.

The invention claimed is:

1. A continuous-time (CT) analog-to-digital converter (ADC), comprising:
    a delay circuit, configured to generate a delay circuit output signal by applying a delay to an analog input signal;
    a sub-ADC, configured to generate a sub-ADC output signal based on the analog input signal;
    an error correction circuit, configured to generate a digital error-corrected signal based on the sub-ADC output signal; and
    a digital reconstruction filter (DRF) combiner, configured to generate an ADC output signal based on the digital error-corrected signal.

2. The CT ADC according to claim 1, wherein:
    the error correction circuit includes an error correction unit and at least one adder, the error correction unit includes a plurality of error correction blocks configured to generate a plurality of digital corrections based on one or more error estimates, and the at least one adder is configured to add the plurality of digital corrections to the sub-ADC output signal to generate the digital error-corrected signal.

3. The CT ADC according to claim 2, wherein:
the at least one adder includes a first adder and a second adder,
the first adder is configured to, for an individual bit of a plurality of bits of the sub-ADC output signal, add the individual bit and a corresponding one of the plurality of digital corrections to generate an individual error-corrected bit of a plurality of error-corrected bits of an error-corrected sub-ADC output signal, and
the second adder is configured to add the plurality of error-corrected bits to generate the digital error-corrected signal.

4. The CT ADC according to claim 2, wherein:
the at least one adder includes a first adder, a second adder, and a third adder,
the first adder is configured to add individual digital corrections of the plurality of digital corrections to generate a digital correction sum,
the second adder is configured to add individual bits of a plurality of bits of the sub-ADC output signal to generate a sub-ADC output sum, and
the third adder is configured to add the digital correction sum and the sub-ADC output sum.

5. The CT ADC according to claim 2, wherein the one or more error estimates include one or more of an estimate of a static error, an estimate of a timing error, and an estimate of a switching error.

6. The CT ADC according to claim 5, wherein the static error is an error based on device mismatch.

7. The CT ADC according to claim 5, wherein the timing error is an error based on one or more of driver mismatch or switch mismatch.

8. The CT ADC according to claim 5, wherein the switching error is an error based on a pulse-width error.

9. The CT ADC according to claim 2, wherein:
the sub-ADC output signal includes M bits,
M is an integer greater than or equal to 1,
the plurality of error correction blocks includes M error correction blocks, and
each of the M error correction blocks corresponds to a respective one of the M bits of the sub-ADC output signal.

10. The CT ADC according to claim 9, further comprising a sub-digital-to-analog converter (sub-DAC), wherein:
the sub-DAC is to generate a sub-DAC output signal, and
the sub-DAC includes M sub-DAC units.

11. The CT ADC according to claim 2, further comprising:
an error extraction arrangement to generate the one or more error estimates.

12. The CT ADC according to claim 11, wherein:
the CT ADC further includes a backend-ADC, a sub-digital-to-analog converter (sub-DAC) that includes M sub-DAC units, a first cross-correlator, and a second cross-correlator, and
wherein the error extraction arrangement is configured to generate the one or more error estimates by:
disabling provision of the analog input signal to the CT ADC,
selecting one sub-DAC unit of the M sub-DAC units as a reference sub-DAC unit,
selecting another sub-DAC unit of the M sub-DAC units as a measurement sub-DAC unit,
applying a first pseudo-random bit sequence (PRBS) to the reference sub-DAC unit,
applying a second PRBS to the measurement sub-DAC unit,
using the first cross-correlator to cross-correlate the first PRBS with an output of the backend-ADC generated when the first PRBS is applied to the reference sub-DAC and the second PRBS is applied to the measurement sub-DAC,
using the second cross-correlator to cross-correlate a product of the first PRBS and a delayed first PRBS with the output of the backend-ADC generated when the first PRBS is applied to the reference sub-DAC and the second PRBS is applied to the measurement sub-DAC, and
generating the one or more error estimates based on outputs of the first and second cross-correlators.

13. The CT ADC according to claim 12, wherein the error extraction arrangement is configured to generate the one or more error estimates further by:
applying the second PRBS to the reference sub-DAC unit,
applying the first PRBS to the measurement sub-DAC unit,
using the first cross-correlator to cross-correlate the first PRBS with an output of the backend-ADC generated when the second PRBS is applied to the reference sub-DAC and the first PRBS is applied to the measurement sub-DAC,
using the second cross-correlator to cross-correlate a product of the first PRBS and a delayed first PRBS with the output of the backend-ADC generated when the second PRBS is applied to the reference sub-DAC and the first PRBS is applied to the measurement sub-DAC, and
generating the one or more error estimates based on outputs of the first and second cross-correlators.

14. The CT ADC according to claim 12, wherein the second PRBS is a negative version of the first PRBS.

15. The CT ADC according to claim 11, wherein:
the CT ADC further includes a backend-ADC, a sub-digital-to-analog converter (sub-DAC) that includes M+2 sub-DAC units, a first cross-correlator, and a second cross-correlator,
the sub-ADC output signal includes M bits, and
wherein the error extraction arrangement is configured to generate the one or more error estimates by:
selecting one sub-DAC unit of the M+2 sub-DAC units as a reference sub-DAC unit,
selecting another sub-DAC unit of the M+2 sub-DAC units as a measurement sub-DAC unit,
applying a first pseudo-random bit sequence (PRBS) to the reference sub-DAC unit,
applying a second PRBS to the measurement sub-DAC unit,
using the first cross-correlator to cross-correlate the first PRBS with an output of the backend-ADC generated when the first PRBS is applied to the reference sub-DAC and the second PRBS is applied to the measurement sub-DAC,
using the second cross-correlator to cross-correlate a product of the first PRBS and a delayed first PRBS with the output of the backend-ADC generated when the first PRBS is applied to the reference sub-DAC and the second PRBS is applied to the measurement sub-DAC, and generating the one or more error estimates based on outputs of the first and second cross-correlators.

16. The CT ADC according to claim 15, wherein the second PRBS is a negative version of the first PRBS.

17. A device for assisting error correction in a continuous-time (CT) analog-to-digital converter (ADC), the device comprising:

means for disabling provision of an analog input signal to the CT ADC;

means for selecting one sub-digital-to-analog converter (sub-DAC) unit of M sub-DAC units of the CT ADC as a reference sub-DAC unit;

means for selecting another sub-DAC unit of the M sub-DAC units as a measurement sub-DAC unit;

means for applying a first pseudo-random bit sequence (PRBS) to the reference sub-DAC unit;

means for applying a second PRBS to the measurement sub-DAC unit;

a first cross-correlator to cross-correlate the first PRBS with an output of a backend-ADC of the CT ADC, wherein the output of the backend-ADC is generated when the first PRBS is applied to the reference sub-DAC and the second PRBS is applied to the measurement sub-DAC;

a second cross-correlator to cross-correlate a product of the first PRBS and a delayed first PRBS with the output of the backend-ADC generated when the first PRBS is applied to the reference sub-DAC and the second PRBS is applied to the measurement sub-DAC; and means for generating one or more error estimates based on outputs of the first and second cross-correlators.

18. The device according to claim 17, further comprising:

an error correction unit to use the one or more error estimates to apply error correction to an output of a sub-ADC to generate an output of the error correction unit, wherein the output of the error correction unit is a digital signal.

19. A device for assisting error correction in a continuous-time (CT) analog-to-digital converter (ADC), the device comprising:

the CT ADC further includes a backend-ADC, a sub-digital-to-analog converter (sub-DAC) that includes M+2 sub-DAC units, a first cross-correlator, and a second cross-correlator, the sub-ADC output signal includes M bits, and means for selecting one sub-digital-to-analog converter (sub-DAC) unit of the M+2 sub-DAC units of the CT ADC as a reference sub-DAC unit;

means for selecting another sub-DAC unit of the M+2 sub-DAC units as a measurement sub-DAC unit;

means for applying a first pseudo-random bit sequence (PRBS) to the reference sub-DAC unit;

means for applying a second PRBS to the measurement sub-DAC unit;

a first cross-correlator to cross-correlate the first PRBS with an output of a backend-ADC of the CT ADC, wherein the output of the backend-ADC is generated when the first PRBS is applied to the reference sub-DAC and the second PRBS is applied to the measurement sub-DAC;

a second cross-correlator to cross-correlate a product of the first PRBS and a delayed first PRBS with the output of the backend-ADC generated when the first PRBS is applied to the reference sub-DAC and the second PRBS is applied to the measurement sub-DAC; and means for generating the one or more error estimates based on outputs of the first and second cross-correlators.

20. The device according to claim 19, further comprising:

an error correction unit to use the one or more error estimates to apply error correction to an output of a sub-ADC to generate an output of the error correction unit, wherein the output of the error correction unit is a digital signal.

* * * * *